(12) United States Patent
Masuoka et al.

(10) Patent No.: US 10,199,381 B2
(45) Date of Patent: Feb. 5, 2019

(54) PILLAR-SHAPED SEMICONDUCTOR MEMORY DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/637,462

(22) Filed: Jun. 29, 2017

(65) Prior Publication Data

US 2017/0309632 A1    Oct. 26, 2017

Related U.S. Application Data

(63) Continuation of application No. PCT/JP2015/060763, filed on Apr. 6, 2015.

(51) Int. Cl.
   *H01L 27/11* (2006.01)
   *H01L 21/225* (2006.01)
   (Continued)

(52) U.S. Cl.
   CPC ...... *H01L 27/1104* (2013.01); *H01L 21/2254* (2013.01); *H01L 21/324* (2013.01);
   (Continued)

(58) Field of Classification Search
   CPC ......... H01L 21/76805; H01L 21/76831; H01L 21/76877; H01L 23/5226; H01L 27/11;
   (Continued)

(56) References Cited

U.S. PATENT DOCUMENTS

2003/0136978 A1   7/2003  Takaura et al.
2004/0262635 A1  12/2004  Lee
(Continued)

FOREIGN PATENT DOCUMENTS

JP     02-188966 A    7/1990
JP    H03-024753 A    2/1991
(Continued)

OTHER PUBLICATIONS

Gandhi, R. et al. "Vertical Si-Nanowire n-Type Tunneling FETs With Low Subthreshold Swing(<50mV/decade) at Room Temperature", *IEEE Electron Device Letter*, vol. 32, No. 4, 2011 pp. 437-439.

(Continued)

*Primary Examiner* — Shahed Ahmed
(74) *Attorney, Agent, or Firm* — Brinks Gilson & Lione

(57) ABSTRACT

An SRAM includes three Si pillars. In upper parts of the Si pillars, a first load P-channel, a first driver N-channel, and a first selection N-channel are formed, and in lower parts of the Si pillars, a second load P-channel, a second driver N-channel, and a second selection N-channel are formed. At the same height in the Si pillars, a P+ layer and N+ layers that serve as drains are formed, and these layers are connected to connected gates surrounding the second load P-channel and the second driver N-channel. At the same height in the Si pillars, a P+ layer and N+ layers that serve as drains are formed, and these layers are connected to connected gates surrounding the first load P-channel and the first driver N-channel. Gates surrounding the first and second selection N-channels are connected to a word-line terminal.

10 Claims, 18 Drawing Sheets

(51) Int. Cl.
| | |
|---|---|
| *H01L 21/324* | (2006.01) |
| *H01L 21/8238* | (2006.01) |
| *H01L 23/522* | (2006.01) |
| *H01L 23/528* | (2006.01) |
| *H01L 29/08* | (2006.01) |
| *H01L 29/10* | (2006.01) |
| *H01L 29/423* | (2006.01) |
| *H01L 29/78* | (2006.01) |
| *H01L 29/66* | (2006.01) |

(52) U.S. Cl.
CPC ........... *H01L 21/823814* (2013.01); *H01L 21/823828* (2013.01); *H01L 21/823857* (2013.01); *H01L 21/823871* (2013.01); *H01L 21/823885* (2013.01); *H01L 23/528* (2013.01); *H01L 23/5226* (2013.01); *H01L 29/0847* (2013.01); *H01L 29/1037* (2013.01); *H01L 29/42356* (2013.01); *H01L 29/66666* (2013.01); *H01L 29/7827* (2013.01)

(58) Field of Classification Search
CPC ......... H01L 29/42356; H01L 29/66666; H01L 29/7827; H01L 27/11807; H01L 29/42392; H01L 21/823885; H01L 27/092; H01L 27/1104; H01L 21/2254; H01L 21/324; H01L 21/823814; H01L 23/528
See application file for complete search history.

(56) References Cited

U.S. PATENT DOCUMENTS

| | | | |
|---|---|---|---|
| 2010/0219483 A1 | 9/2010 | Masuoka et al. | |
| 2014/0061808 A1 | 3/2014 | Nakatsuka et al. | |
| 2014/0262635 A1* | 9/2014 | Vinck | F16D 55/226 188/72.6 |
| 2015/0017767 A1* | 1/2015 | Masuoka | H01L 27/092 438/211 |

FOREIGN PATENT DOCUMENTS

| | | |
|---|---|---|
| JP | 2003-224211 A | 8/2003 |
| JP | 2007-525004 A | 8/2007 |
| JP | 2010-040538 A | 2/2010 |
| JP | 2012-209340 A | 10/2012 |
| JP | 2014-53424 A | 3/2014 |
| JP | 5692884 B1 | 4/2015 |
| WO | WO2014/184933 A1 | 11/2014 |

OTHER PUBLICATIONS

International Search Report, and English language translation thereof, in corresponding International Application No. PCT/JP2015/069689, dated Aug. 4, 2015, 4 pages.
International Search Report, and English language translation thereof, in corresponding International Application No. PCT/JP2015/078776, dated Nov. 10, 2015, 10 pages.
International Search Report, and English language translation thereof, in corresponding International Application No. PCT/JP2016/066151, dated Aug. 2, 2016, 7 pages.
International Preliminary Report on Patentability in corresponding International Application No. PCT/JP2015/078776, dated Oct. 12, 2017, 6 pages.
International Preliminary Report on Patentability in corresponding International Application No. PCT/JP2015/060763, dated Oct. 19, 2017, 5 pages.
English language translation of International Preliminary Examination Report in International Application No. PCT/JP2015/069689, dated Jan. 11, 2018, 6 pages.
Morimoto, T. et al., "Self-Aligned Nickel-Mono-Silicide Technology for High-Speed Deep Submicrometer Logic CMOS ULSI", *IEEE Transactions on Electron Devices*, vol. 42, No. 5, May 1995, pp. 915-922.
Shibata, T. et al., "A New Field Isolation Technology for High Density MOS LSI", *Japanese Journal of Applied Physics*, vol. 18, Supplement 18-1, 1979, pp. 263-267.
Takato, H. et al., "Impact of Surrounding Gate Transistor (SGT) for Ultra-High-Density LSI's" *IEEE Transactions on Electron Devices*, vol. 38, No. 3, Mar. 1991, 6 pages.
International Search Report, and English language translation thereof, in corresponding International Application No. PCT/JP2015/060763, dated May 26, 2015, 5 pages.

* cited by examiner

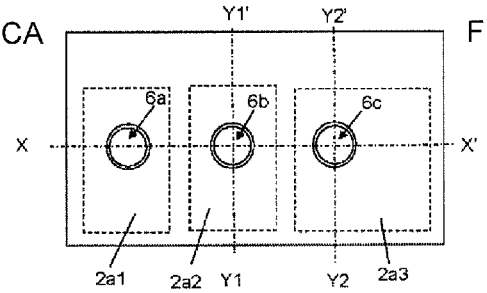
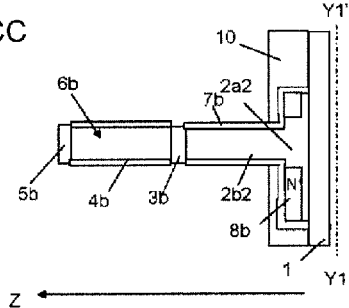
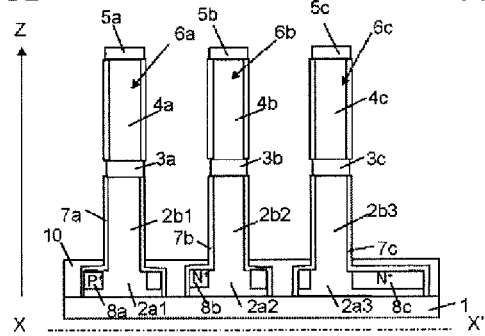
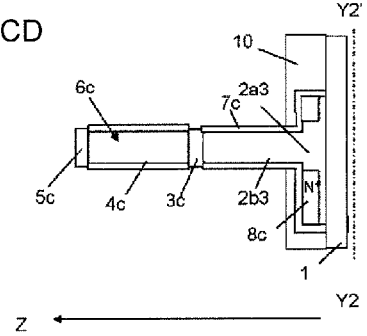
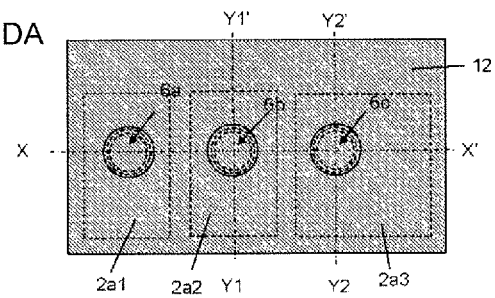
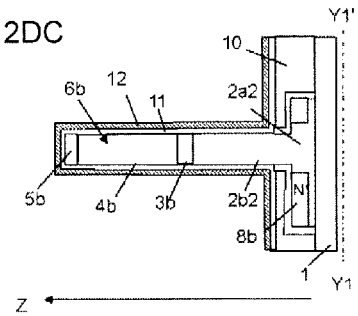
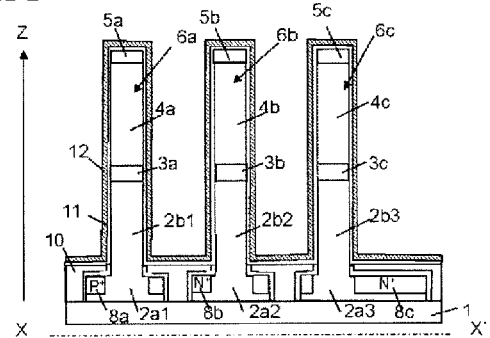
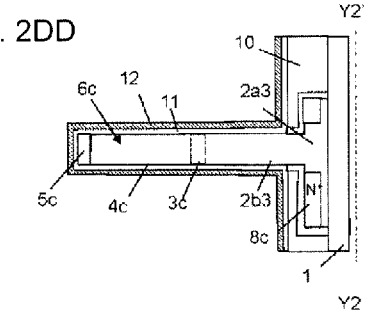

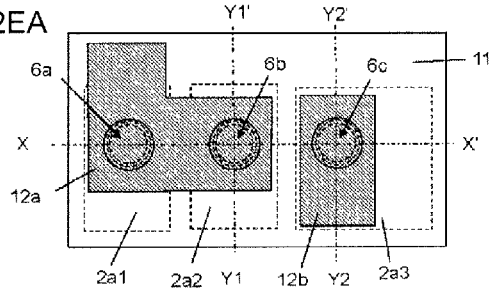
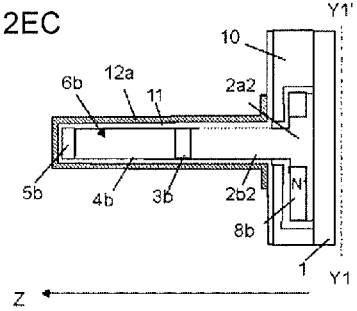
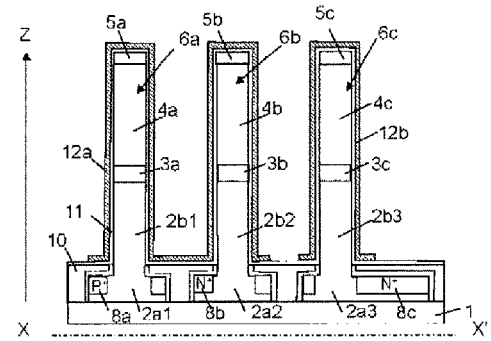
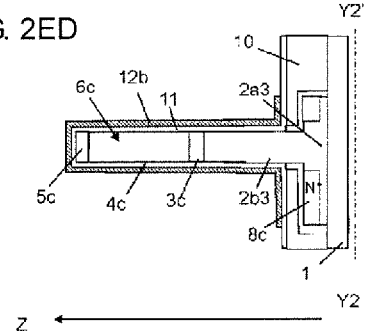
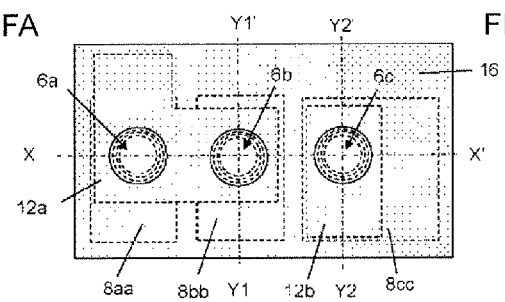
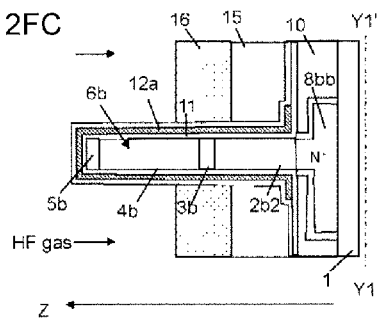
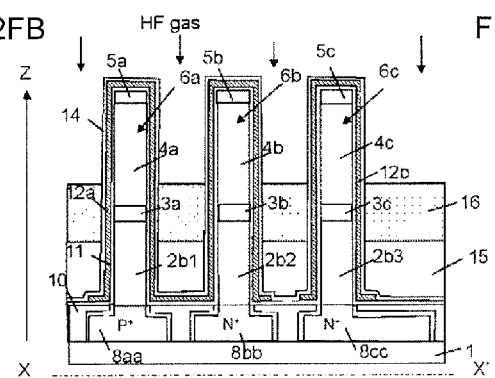
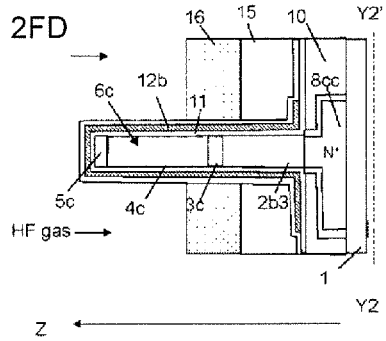

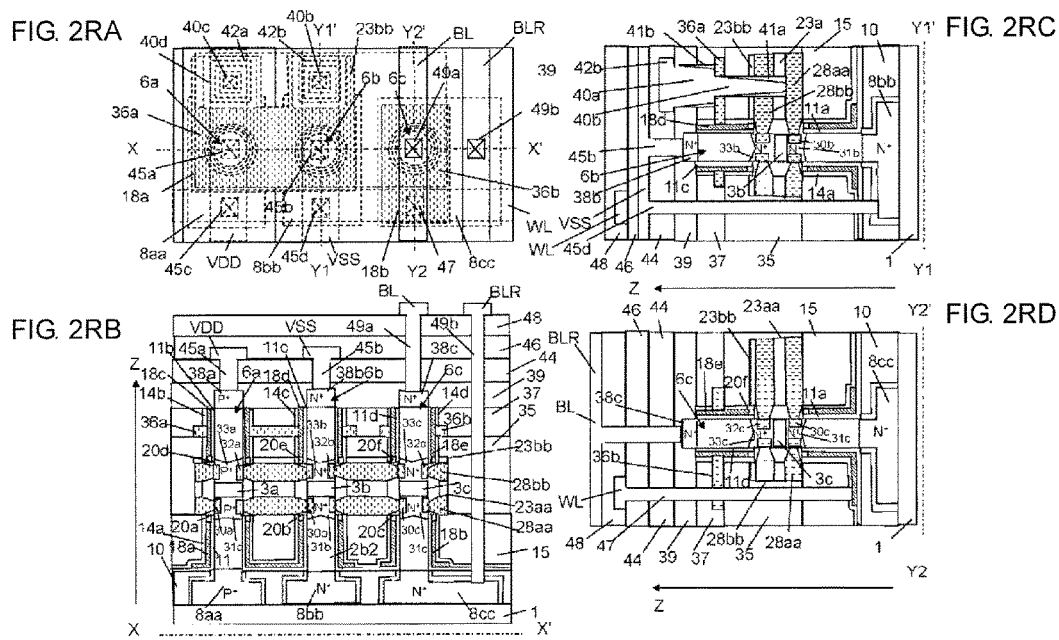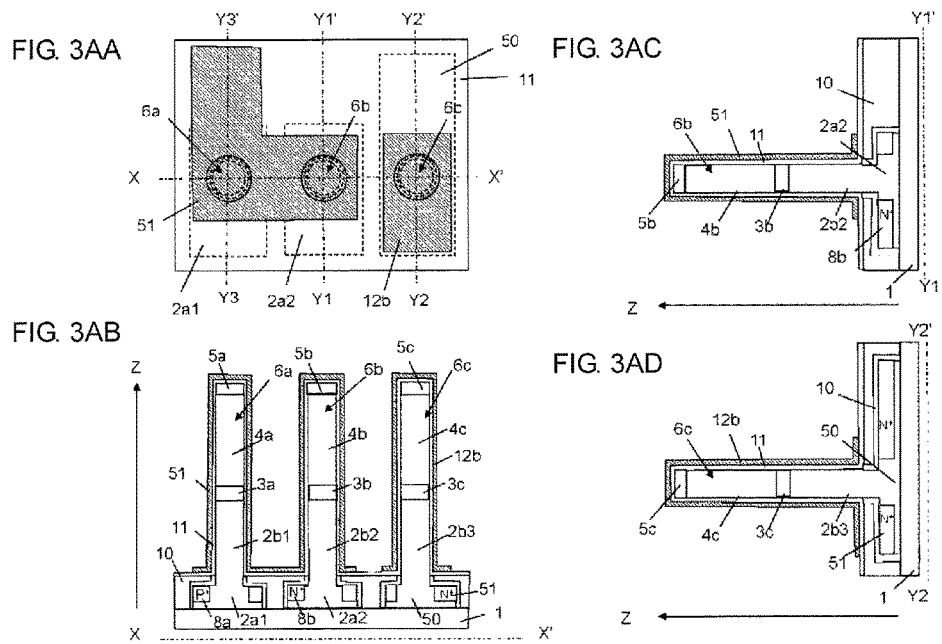

PILLAR-SHAPED SEMICONDUCTOR MEMORY DEVICE AND METHOD FOR PRODUCING THE SAME

RELATED APPLICATIONS

The present application is a continuation of International Application PCT/JP2015/060763, with an international filing date of Apr. 6, 2015, the entire content of which is incorporated herein by reference.

BACKGROUND OF THE INVENTION

1. Field of the Invention

The present invention relates to a pillar-shaped semiconductor memory device and a method for producing the device.

2. Description of the Related Art

Surrounding gate MOS transistors (SGTs), which are representative pillar-shaped semiconductor devices, have recently been attracting attention as semiconductor elements that provide semiconductor devices having high degrees of integration. There is a need for further increases in the degree of integration and the performance of semiconductor memory devices including SGTs.

In a typical planar MOS transistor, a channel extends horizontally along the upper surface of a semiconductor substrate. By contrast, a channel of an SGT extends perpendicularly to the upper surface of a semiconductor substrate (see, for example, Japanese Unexamined Patent Application Publication No. 2-188966, Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, compared with planar MOS transistors, SGTs can provide semiconductor devices with higher densities.

FIG. 6 is a structural schematic view of an N-channel SGT. A Si pillar 100 (silicon semiconductor pillars are hereinafter referred to as "Si pillars") having P-type or i-type (intrinsic) conductivity includes in its lower and upper positions an $N^+$ layer 101a and an $N^+$ layer 101b (semiconductor regions containing high concentrations of donor impurities are hereinafter referred to as "$N^+$ layers"). When the $N^+$ layer 101a serves as a source, the $N^+$ layer 101b serves as a drain, and when the $N^+$ layer 101a serves as a drain, the $N^+$ layer 101b serves as a source. A portion of the Si pillar 100 that lies between the N+ layers 101a and 101b, serving as a source and a drain, is a channel region 102. A gate insulating layer 103 is formed so as to surround the channel region 102. A gate conductor layer 104 is formed so as to surround the gate insulating layer 103. In the SGT, the $N^+$ regions 101a and 101b, serving as a source and a drain, the channel region 102, the gate insulating layer 103, and the gate conductor layer 104 are formed in or on the single Si pillar 100. Thus, in plan view, the area occupied by the SGT corresponds to the area occupied by a single source or drain $N^+$ layer of a planar MOS transistor. Therefore, circuit chips including SGTs can be even smaller than circuit chips including planar MOS transistors.

A memory cell in a static random access memory (SRAM) circuit includes six SGTs as illustrated in FIG. 6 (see, for example, U.S. Publication No. 2010/0219483). Typically, the SGTs constituting an SRAM memory cell are formed in different semiconductor pillars.

An increase in the density of an SRAM memory cell leads to a reduction in the cost of a semiconductor memory device chip including an SRAM circuit.

Thus, there is a need for high-density SRAM cell circuits. In addition, there is also a need for improvement in the performance of semiconductor memory device chips, for example, an increase in the speed of an SRAM cell circuit.

SUMMARY OF THE INVENTION

There is a need for increases in the density and performance of SRAM cell circuits.

A pillar-shaped semiconductor memory device according to a first aspect of the present invention includes:

a substrate;

a first semiconductor pillar, a second semiconductor pillar, and a third semiconductor pillar, each standing in a direction perpendicular to a surface of the substrate;

a first impurity region and a second impurity region formed separately from each other in the first semiconductor pillar;

a first gate insulating layer that surrounds a portion of the first semiconductor pillar located between the first impurity region and the second impurity region in the perpendicular direction;

a first gate conductor layer that surrounds the first gate insulating layer;

a third impurity region and a fourth impurity region formed separately from each other below the first impurity region and the second impurity region in the first semiconductor pillar;

a second gate insulating layer that surrounds a portion of the first semiconductor pillar located between the third impurity region and the fourth impurity region in the perpendicular direction;

a second gate conductor layer that surrounds the second gate insulating layer;

a fifth impurity region and a sixth impurity region formed separately from each other in the second semiconductor pillar;

a third gate insulating layer that surrounds a portion of the second semiconductor pillar located between the fifth impurity region and the sixth impurity region in the perpendicular direction;

a third gate conductor layer that surrounds the third gate insulating layer;

a seventh impurity region and an eighth impurity region formed separately from each other below the fifth impurity region and the sixth impurity region in the second semiconductor pillar;

a fourth gate insulating layer that surrounds a portion of the second semiconductor pillar located between the seventh impurity region and the eighth impurity region in the perpendicular direction;

a fourth gate conductor layer that surrounds the fourth gate insulating layer;

a ninth impurity region and a tenth impurity region formed separately from each other in the third semiconductor pillar;

a fifth gate insulating layer that surrounds a portion of the third semiconductor pillar located between the ninth impurity region and the tenth impurity region in the perpendicular direction;

a fifth gate conductor layer that surrounds the fifth gate insulating layer;

an eleventh impurity region and a twelfth impurity region formed separately from each other below the ninth impurity region and the tenth impurity region in the third semiconductor pillar;

a sixth gate insulating layer that surrounds a portion of the third semiconductor pillar located between the eleventh impurity region and the twelfth impurity region in the perpendicular direction;

a sixth gate conductor layer that surrounds the sixth gate insulating layer; and a first interlayer insulating layer disposed in the third semiconductor pillar between one of the ninth impurity region and the tenth impurity region which is located lower than the other in the perpendicular direction and one of the eleventh impurity region and the twelfth impurity region which is located upper than the other in the perpendicular direction.

In the pillar-shaped semiconductor memory device, the first impurity region, the second impurity region, the first gate insulating layer, and the first gate conductor layer constitute a first surrounding gate MOS transistor (SGT), the third impurity region, the fourth impurity region, the second gate insulating layer, and the second gate conductor layer constitute a second SGT, the fifth impurity region, the sixth impurity region, the third gate insulating layer, and the third gate conductor layer constitute a third SGT, the seventh impurity region, the eighth impurity region, the fourth gate insulating layer, and the fourth gate conductor layer constitute a fourth SGT, the ninth impurity region, the tenth impurity region, the fifth gate insulating layer, and the fifth gate conductor layer constitute a fifth SGT, the eleventh impurity region, the twelfth impurity region, the sixth gate insulating layer, and the sixth gate conductor layer constitute a sixth SGT, the first impurity region, the fifth impurity region, and the ninth impurity region are connected to a first wiring conductor layer, the second gate conductor layer and the fourth gate conductor layer are connected to a second wiring conductor layer, the first wiring conductor layer and the second wiring conductor layer are connected to each other, the third impurity region, the seventh impurity region, and the eleventh impurity region are connected to a third wiring conductor layer, the first gate conductor layer and the third gate conductor layer are connected to a fourth wiring conductor layer, the third wiring conductor layer and the fourth wiring conductor layer are connected to each other, and the fifth gate conductor layer and the sixth gate conductor layer are connected to each other, thus forming an SRAM cell circuit.

Preferably, the pillar-shaped semiconductor memory device further includes:

a second interlayer insulating layer formed in a middle part of the first semiconductor pillar; and a third interlayer insulating layer formed in a middle part of the second semiconductor pillar.

Preferably, in the pillar-shaped semiconductor memory device, the first impurity region is disposed above the second interlayer insulating layer in a connected manner, the second impurity region is formed above the first impurity region, the third impurity region is disposed below the second interlayer insulating layer in a connected manner, the fourth impurity region is formed below the third impurity region, the fifth impurity region is disposed above the third interlayer insulating layer in a connected manner, the sixth impurity region is formed above the fifth impurity region, the seventh impurity region is disposed below the third interlayer insulating layer in a connected manner, the eighth impurity region is formed below the seventh impurity region, the ninth impurity region is disposed above the first interlayer insulating layer, which is formed in a middle part of the third semiconductor pillar, in a connected manner, the tenth impurity region is formed above the ninth impurity region, the eleventh impurity region is disposed below the first interlayer insulating layer in a connected manner, the twelfth impurity region is formed below the eleventh impurity region, the second impurity region and the fourth impurity region are connected to a power supply wiring conductor layer, the sixth impurity region and the eighth impurity region are connected to a ground wiring conductor layer, the fifth gate conductor layer and the sixth gate conductor layer are connected to a word-line wiring conductor layer, and one of the tenth impurity region and the eleventh impurity region is connected to a bit-line wiring conductor layer, and the other is connected to an inverted bit-line wiring conductor layer.

Preferably, the pillar-shaped semiconductor memory device further includes:

a fourth interlayer insulating layer formed in a middle part of the first semiconductor pillar; and a fifth interlayer insulating layer formed in a middle part of the second semiconductor pillar.

Preferably, in the pillar-shaped semiconductor memory device, the second impurity region is disposed above the fourth interlayer insulating layer in a connected manner, the first impurity region is formed above the second impurity region, the fourth impurity region is disposed below the fourth interlayer insulating layer in a connected manner, the third impurity region is formed below the fourth impurity region, the sixth impurity region is disposed above the fifth interlayer insulating layer in a connected manner, the fifth impurity region is formed above the sixth impurity region, the eighth impurity region is disposed below the fifth interlayer insulating layer in a connected manner, the seventh impurity region is formed below the eighth impurity region, the tenth impurity region is disposed above the first interlayer insulating layer, which is formed in the middle part of the third semiconductor pillar, in a connected manner, the ninth impurity region is formed above the tenth impurity region, the twelfth impurity region is disposed below the first interlayer insulating layer in a connected manner, the eleventh impurity region is formed below the twelfth impurity region, the second impurity region and the fourth impurity region are connected to a power supply wiring conductor layer, the sixth impurity region and the eighth impurity region are connected to a ground wiring conductor layer, the fifth gate conductor layer and the sixth gate conductor layer are connected to a word-line wiring conductor layer, and one of the tenth impurity region and the twelfth impurity region is connected to a bit-line wiring conductor layer, and the other is connected to an inverted bit-line wiring conductor layer.

Preferably, in the pillar-shaped semiconductor memory device, a thirteenth impurity region is formed in place of the second impurity region, the fourth interlayer insulating layer, and the fourth impurity region, a fourteenth impurity region is formed in place of the sixth impurity region, the fifth interlayer insulating layer, and the eighth impurity region, the thirteenth impurity region is connected to the power supply wiring conductor layer, and the fourteenth impurity region is connected to the ground wiring conductor layer.

Preferably, the pillar-shaped semiconductor memory device further includes:

a fourth semiconductor pillar adjacent to the second semiconductor pillar;

a fifteenth impurity region and a sixteenth impurity region formed separately from each other in the fourth semiconductor pillar;

a seventh gate insulating layer that surrounds a portion of the fourth semiconductor pillar located between the fifteenth impurity region and the sixteenth impurity region in the perpendicular direction;

a seventh gate conductor layer that surrounds the seventh gate insulating layer;

a seventeenth impurity region and an eighteenth impurity region formed separately from each other below the fifteenth impurity region and the sixteenth impurity region in the fourth semiconductor pillar;

an eighth gate insulating layer that surrounds a portion of the fourth semiconductor pillar located between the seventeenth impurity region and the eighteenth impurity region in the perpendicular direction; and an eighth gate conductor layer that surrounds the eighth gate insulating layer.

Preferably, in the pillar-shaped semiconductor memory device, the fifth impurity region and the fifteenth impurity region are connected to each other, the sixth impurity region is connected to the sixteenth impurity region, the seventh impurity region in connected to the seventeenth impurity region, the eighth impurity region is connected to the eighteenth impurity region, the third gate conductor layer is connected to the seventh gate conductor layer, the fourth gate conductor layer is connected to the eighth gate conductor layer, the fifth impurity region and the fifteenth impurity region include an impurity atom of the same polarity, the sixth impurity region and the sixteenth impurity region include an impurity atom of the same polarity, the seventh impurity region and the seventeenth impurity region include an impurity atom of the same polarity, and the eighth impurity region and the eighteenth impurity region include an impurity atom of the same polarity.

Preferably, in the pillar-shaped semiconductor memory device, the first semiconductor pillar and the second semiconductor pillar are formed adjacent to each other.

Preferably, in the pillar-shaped semiconductor memory device, in plan view, at least a portion of the third wiring conductor layer, at least a portion of the first wiring conductor layer, and at least a portion of the fourth wiring conductor layer overlap one another in the order mentioned.

Preferably, the pillar-shaped semiconductor memory device further includes:

a first contact hole that extends through the at least a portion of the first wiring conductor layer and the at least a portion of the fourth wiring conductor layer and that is connected to the at least a portion of the third wiring conductor layer;

a first separation insulating layer on a side surface of the first wiring conductor layer facing an interior of the first contact hole; and a third wiring conductor layer-to-fourth wiring conductor layer-connecting wiring conductor layer that connects the third wiring conductor layer to the fourth wiring conductor layer via the first contact hole.

Preferably, in the pillar-shaped semiconductor memory device, in plan view, at least a portion of the second wiring conductor layer, at least a portion of the third wiring conductor layer, and at least a portion of the first wiring conductor layer overlap one another in the order mentioned.

Preferably, the pillar-shaped semiconductor memory device further includes:

a second contact hole that extends through the at least a portion of the first wiring conductor layer and the at least a portion of the third wiring conductor layer and that is connected to the at least a portion of the second wiring conductor layer;

a second separation insulating layer on a side surface of the third wiring conductor layer facing an interior of the second contact hole; and a first wiring conductor layer-to-second wiring conductor layer-connecting wiring conductor layer that connects the first wiring conductor layer to the second wiring conductor layer via the second contact hole.

Preferably, in the pillar-shaped semiconductor memory device, in plan view, at least a portion of the bit-line wiring conductor layer and at least a portion of the inverted bit-line wiring conductor layer overlap each other.

Preferably, the pillar-shaped semiconductor memory device further includes:

a third contact hole that extends through one of the at least a portion of the bit-line wiring conductor layer and the at least a portion of the inverted bit-line wiring conductor layer which is located lower than the other in the perpendicular direction;

a third separation insulating layer on a side surface of one of the at least a portion of the bit-line wiring conductor layer and the at least a portion of the inverted bit-line wiring conductor layer through which the third contact hole extends, the side surface facing an interior of the third contact hole; and a first signal wiring layer that connects via the third contact hole the tenth impurity region or the eleventh impurity region to one of the at least a portion of the bit-line wiring conductor layer and the at least a portion of the inverted bit-line wiring conductor layer through which the third contact hole does not extend.

A method for producing a pillar-shaped semiconductor memory device according to a second aspect of the present invention includes:

forming a first semiconductor pillar, a second semiconductor pillar, and a third semiconductor pillar on a substrate such that the pillars stand in a direction perpendicular to a surface of the substrate, the third semiconductor pillar having a first interlayer insulating layer in a middle part in the perpendicular direction;

foaming a gate insulating layer such that the gate insulating layer surrounds each of the first semiconductor pillar, the second semiconductor pillar, and the third semiconductor pillar;

forming a gate conductor layer such that the gate conductor layer surrounds each of the gate insulating layers surrounding the first semiconductor pillar, the second semiconductor pillar, and the third semiconductor pillar;

forming, in the first semiconductor pillar, a first impurity region and a second impurity region separately from each other below the first interlayer insulating layer in the perpendicular direction, forming, in the second semiconductor pillar, a third impurity region and a fourth impurity region separately from each other below the first interlayer insulating layer in the perpendicular direction, and forming, in the third semiconductor pillar, a fifth impurity region and a sixth impurity region separately from each other below the first interlayer insulating layer in the perpendicular direction;

forming, in the first semiconductor pillar, a seventh impurity region and an eighth impurity region separately from each other above the first interlayer insulating layer in the perpendicular direction, forming, in the second semiconductor pillar, a ninth impurity region and a tenth impurity region separately from each other above the first interlayer insulating layer in the perpendicular direction, and forming, in the third semiconductor pillar, an eleventh impurity region and a twelfth impurity region separately from each other above the first interlayer insulating layer in the perpendicular direction;

processing the gate conductor layer around the first semiconductor pillar with a portion between the first impurity region and the second impurity region and a portion between the seventh impurity region and the eighth impurity region in the perpendicular direction left unprocessed to respectively form a first gate conductor layer and a second gate conductor layer, processing the gate conductor layer around the second semiconductor pillar with a portion between the third impurity region and the fourth impurity region and a portion between the ninth impurity region and the tenth impurity region in the perpendicular direction left unprocessed to respectively form a third gate conductor layer and a fourth gate conductor layer, and processing the gate conductor layer around the third semiconductor pillar with a portion between the fifth impurity region and the sixth impurity region and a portion between the eleventh impurity region and the twelfth impurity region in the perpendicular direction left unprocessed to respectively form a fifth gate conductor layer and a sixth gate conductor layer;

connecting the first gate conductor layer, the third gate conductor layer, the seventh impurity region, the ninth impurity region, and the eleventh impurity region to one another, the impurity regions being at the same height in the perpendicular direction;

connecting the second gate conductor layer, the fourth gate conductor layer, the second impurity region, the fourth impurity region, and the sixth impurity region to one another, the impurity regions being at the same height in the perpendicular direction; and connecting the fifth gate conductor layer and the sixth gate conductor layer to each other.

Preferably, the method for producing a pillar-shaped semiconductor memory device further includes:

forming, in the first semiconductor pillar, a second interlayer insulating layer at the same height as the first interlayer insulating layer in the perpendicular direction; and forming, in the second semiconductor pillar, a third interlayer insulating layer at the same height as the first interlayer insulating layer in the perpendicular direction.

Preferably, in the method for producing a pillar-shaped semiconductor memory device, in the perpendicular direction, the first impurity region is formed below the second impurity region, the third impurity region is formed below the fourth impurity region, the fifth impurity region is formed below the sixth impurity region, the seventh impurity region is formed below the eighth impurity region, the ninth impurity region is formed below the tenth impurity region, and the eleventh impurity region is formed below the twelfth impurity region.

Preferably, in the method for producing a pillar-shaped semiconductor memory device, in the perpendicular direction, the first impurity region is formed above the second impurity region, the third impurity region is formed above the fourth impurity region, the fifth impurity region is formed above the sixth impurity region, the seventh impurity region is formed above the eighth impurity region, the ninth impurity region is formed above the tenth impurity region, and the eleventh impurity region is formed above the twelfth impurity region.

Preferably, the method for producing a pillar-shaped semiconductor memory device further includes:

forming a fourth semiconductor pillar that is adjacent to the second semiconductor pillar and stands in the perpendicular direction;

forming a thirteenth impurity region in the fourth semiconductor pillar, the thirteenth impurity region including an impurity atom that has the same polarity as that of the third impurity region and being connected to the third impurity region at the same height as the third impurity region in the perpendicular direction;

forming a seventh gate conductor layer in the fourth semiconductor pillar, the seventh gate conductor layer surrounding the fourth semiconductor pillar and being connected to the third gate conductor layer at the same height as the third gate conductor layer in the perpendicular direction;

forming a fourteenth impurity region in the fourth semiconductor pillar, the fourteenth impurity region including an impurity atom that has the same polarity as that of the fourth impurity region and being connected to the fourth impurity region at the same height as the fourth impurity region in the perpendicular direction;

forming a fifteenth impurity region in the fourth semiconductor pillar, the fifteenth impurity region including an impurity atom that has the same polarity as that of the ninth impurity region and being connected to the ninth impurity region at the same height as the ninth impurity region in the perpendicular direction;

forming an eighth gate conductor layer in the fourth semiconductor pillar, the eighth gate conductor layer surrounding the fourth semiconductor pillar and being connected to the fourth gate conductor layer at the same height as the fourth gate conductor layer in the perpendicular direction; and forming a sixteenth impurity region in the fourth semiconductor pillar, the sixteenth impurity region including an impurity atom that has the same polarity as that of the tenth impurity region and being connected to the tenth impurity region at the same height as the tenth impurity region in the perpendicular direction.

Preferably, in the method for producing a pillar-shaped semiconductor memory device, the formation of the second impurity region, the fourth impurity region, and the sixth impurity region, which are at the same height in the perpendicular direction, and the formation of the seventh impurity region, the ninth impurity region, and the eleventh impurity region, which are at the same height in the perpendicular direction, are carried out by thermal diffusion from diffusion material layers each containing an acceptor impurity or a donor impurity, and the diffusion material layers are used as wiring conductor layers of an SRAM circuit.

Preferably, in the method for producing a pillar-shaped semiconductor memory device, the formation of the first impurity region, the third impurity region, and the fifth impurity region, which are at the same height in the perpendicular direction, and the formation of the eighth impurity region, the tenth impurity region, and the twelfth impurity region, which are at the same height in the perpendicular direction, are carried out by thermal diffusion from diffusion material layers each containing an acceptor impurity or a donor impurity, and the diffusion material layers are used as wiring conductor layers of an SRAM circuit.

Preferably, in the method for producing a pillar-shaped semiconductor memory device, in the step of forming semiconductor pillars, the first semiconductor pillar and the second semiconductor pillar are formed adjacent to each other.

Preferably, the method for producing a pillar-shaped semiconductor device includes:

forming a first wiring conductor layer that connects the second impurity region, the fourth impurity region, and the sixth impurity region to one another;

forming a second wiring conductor layer that connects the seventh impurity region, the ninth impurity region, and the eleventh impurity region to one another such that the second wiring conductor layer, when viewed in plan, at least partially overlaps the first wiring conductor layer;

forming a third wiring conductor layer that connects the second gate conductor layer and the fourth gate conductor layer to each other such that the third wiring conductor layer, when viewed in plan, at least partially overlaps the first wiring conductor layer and the second wiring conductor layer;

forming a first contact hole in a region where the first wiring conductor layer, the second wiring conductor layer, and the third wiring conductor layer overlap one another in plan view such that the first contact hole extends through the second wiring conductor layer and the third wiring conductor layer to the first wiring conductor layer;

forming a first separation insulating layer on a side surface of the second wiring conductor layer facing an interior of the first contact hole; and connecting the first wiring conductor layer and the third wiring conductor layer to each other via the first contact hole.

Preferably, the method for producing a pillar-shaped semiconductor device includes:

forming a fourth wiring conductor layer that connects the first gate conductor layer and the third gate conductor layer to each other;

forming a fifth wiring conductor layer that connects the second impurity region, the fourth impurity region, and the sixth impurity region to one another such that the fifth wiring conductor layer, when viewed in plan, at least partially overlaps the fourth wiring conductor layer;

forming a sixth wiring conductor layer that connects the seventh impurity region, the ninth impurity region, and the eleventh impurity region to one another such that the sixth wiring conductor layer, when viewed in plan, at least partially overlaps the fourth wiring conductor layer and the fifth wiring conductor layer;

forming a second contact hole in a region where the fourth wiring conductor layer, the fifth wiring conductor layer, and the sixth wiring conductor layer overlap one another in plan view such that the second contact hole extends through the fifth wiring conductor layer and the sixth wiring conductor layer to the fourth wiring conductor layer;

forming a second separation insulating layer on a side surface of the fifth wiring conductor layer facing an interior of the second contact hole; and connecting the fourth wiring conductor layer and the sixth wiring conductor layer to each other via the second contact hole.

According to the present invention, in a pillar-shaped semiconductor memory device including SGTs, one memory cell includes at least three semiconductor pillars and a small number of contact holes that connect wiring layers in the memory cell to one another. This configuration enables a high-density SRAM cell circuit.

BRIEF DESCRIPTION OF THE DRAWINGS

FIGS. 2AB to 2AD are sectional structural views for explaining the method for producing a pillar-shaped semiconductor memory device including SGTs according to the first embodiment;

FIGS. 2BB to 2BD are sectional structural views for explaining the method for producing a pillar-shaped semiconductor memory device including SGTs according to the first embodiment;

FIG. 2CA is a plan view for explaining the method for producing a pillar-shaped semiconductor memory device including SGTs according to the first embodiment;

FIGS. 2CB to 2CD are sectional structural views for explaining the method for producing a pillar-shaped semiconductor memory device including SGTs according to the first embodiment;

FIG. 2DA is a plan view for explaining the method for producing a pillar-shaped semiconductor memory device including SGTs according to the first embodiment;

FIGS. 2DB to 2DD are sectional structural views for explaining the method for producing a pillar-shaped semiconductor memory device including SGTs according to the first embodiment;

FIG. 2EA is a plan view for explaining the method for producing a pillar-shaped semiconductor memory device including SGTs according to the first embodiment;

FIGS. 2EB to 2ED are sectional structural views for explaining the method for producing a pillar-shaped semiconductor memory device including SGTs according to the first embodiment;

FIG. 2FA is a plan view for explaining the method for producing a pillar-shaped semiconductor memory device including SGTs according to the first embodiment;

FIGS. 2FB to 2FD are sectional structural views for explaining the method for producing a pillar-shaped semiconductor memory device including SGTs according to the first embodiment;

FIGS. 2GB to 2GD are sectional structural views for explaining the method for producing a pillar-shaped semiconductor memory device including SGTs according to the first embodiment;

FIGS. 2HB to 2HD are sectional structural views for explaining the method for producing a pillar-shaped semiconductor memory device including SGTs according to the first embodiment;

FIGS. 2IB to 2ID are sectional structural views for explaining the method for producing a pillar-shaped semiconductor memory device including SGTs according to the first embodiment;

FIGS. 2JB to 2JD are sectional structural views for explaining the method for producing a pillar-shaped semiconductor memory device including SGTs according to the first embodiment;

FIGS. 2KB to 2KD are sectional structural views for explaining the method for producing a pillar-shaped semiconductor memory device including SGTs according to the first embodiment;

FIGS. 2LB to 2LD are sectional structural views for explaining the method for producing a pillar-shaped semiconductor memory device including SGTs according to the first embodiment;

FIGS. 2MB to 2MD are sectional structural views for explaining the method for producing a pillar-shaped semiconductor memory device including SGTs according to the first embodiment;

FIGS. 2NB to 2ND are sectional structural views for explaining the method for producing a pillar-shaped semiconductor memory device including SGTs according to the first embodiment;

FIGS. 2PB to 2PD are sectional structural views for explaining the method for producing a pillar-shaped semiconductor memory device including SGTs according to the first embodiment;

FIGS. 2QB to 2QD are sectional structural views for explaining the method for producing a pillar-shaped semiconductor memory device including SGTs according to the first embodiment;

FIG. 2RA is a plan view for explaining the method for producing a pillar-shaped semiconductor memory device including SGTs according to the first embodiment;

FIGS. 2RB to 2RD are sectional structural views for explaining the method for producing a pillar-shaped semiconductor memory device including SGTs according to the first embodiment;

FIG. 3AA is a plan view for explaining a method for producing a pillar-shaped semiconductor memory device including SGTs according to a second embodiment of the present invention;

FIGS. 3AB to 3AD are sectional structural views for explaining the method for producing a pillar-shaped semiconductor memory device including SGTs according to the second embodiment of the present invention;

FIGS. 3BB to 3BD are sectional structural views for explaining the method for producing a pillar-shaped semiconductor memory device including SGTs according to the second embodiment;

FIGS. 3CB to 3CE are sectional structural views for explaining the method for producing a pillar-shaped semiconductor memory device including SGTs according to the second embodiment;

FIGS. 3DB to 3DE are sectional structural views for explaining the method for producing a pillar-shaped semiconductor memory device including SGTs according to the second embodiment;

FIGS. 3EB to 3EE are sectional structural views for explaining the method for producing a pillar-shaped semiconductor memory device including SGTs according to the second embodiment;

FIGS. 4BB to 4BE are sectional structural views for explaining the method for producing a pillar-shaped semiconductor memory device including SGTs according to the third embodiment;

DETAILED DESCRIPTION OF THE PREFERRED EMBODIMENTS

Methods for producing a pillar-shaped semiconductor memory device including SGTs according to the embodiments of the present invention will now be described with reference to drawings.

First Embodiment

A method for producing a pillar-shaped semiconductor memory device including SGTs according to a first embodiment of the present invention will now be described with reference to FIG. 1A, FIG. 1B, and FIGS. 2AA to 2RD.

Figure 1A:
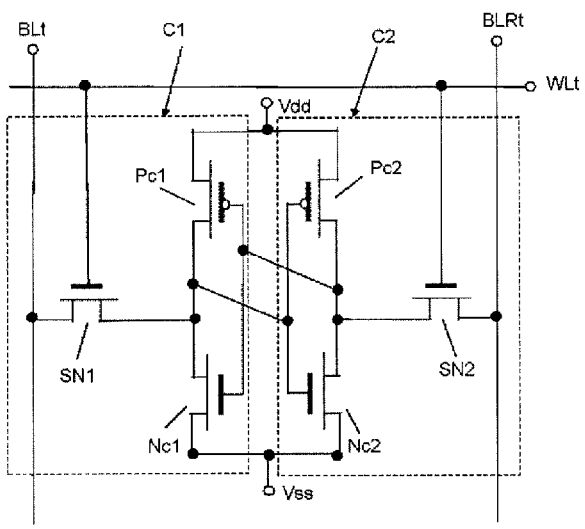
FIG. 1A is a circuit diagram of an SRAM cell for explaining a pillar-shaped semiconductor memory device including SGTs according to a first embodiment of the present invention.

FIG. 1A illustrates a circuit diagram of an SRAM cell according to this embodiment. The SRAM cell circuit includes two inverter circuits. One of the inverter circuits includes a P-channel SGT Pc1 that serves as a load transistor and an N-channel SGT Nc1 that serves as a drive transistor. The other inverter circuit includes a P-channel SGT Pc2 that serves as a load transistor and an N-channel SGT Nc2 that serves as a drive transistor. A gate of the P-channel SGT Pc1 and a gate of the N-channel SGT Nc1 are connected to each other. A drain of the P-channel SGT Pc2 and a drain of the N-channel SGT Nc2 are connected to each other. A gate of the P-channel SGT Pc2 and a gate of the N-channel SGT Nc2 are connected to each other. A drain of the P-channel SGT Pc1 and a drain of the N-channel SGT Nc1 are connected to each other.

As illustrated in FIG. 1A, sources of the P-channel SGTs Pc1 and Pc2 are connected to a power supply terminal Vdd, and sources of the N-channel SGTs Nc1 and Nc2 are connected to a ground terminal Vss. Selection N-channel SGTs SN1 and SN2 are separately disposed in either of the two inverter circuits. Gates of the selection N-channel SGTs SN1 and SN2 are connected to a word-line terminal WLt. A source of the selection N-channel SGT SN1 is connected to the drains of the N-channel SGT Nc1 and the P-channel SGT Pc1, and a drain of the selection N-channel SGT SN1 is connected to a bit-line terminal BLt. A source of the selection N-channel SGT SN2 is connected to the drains of the N-channel SGT Nc2 and the P-channel SGT Pc2, and a drain of the selection N-channel SGT SN2 is connected to an inverted bit-line terminal BLRt. That is to say, the circuit having an SRAM cell (hereinafter referred to as the "SRAM cell circuit") according to this embodiment includes six SGTs: two P-channel SGTs Pc1 and Pc2 and four N-channel SGTs Nc1, Nc2, SN1, and SN2. The SRAM cell circuit includes a circuit region C1 including the P-channel SGT Pc1, the N-channel SGT Nc1, and the SN1, and a circuit region C2 including the P-channel SGT Pc2, the N-channel SGT Nc2, and the SN2.

Figure 1B:
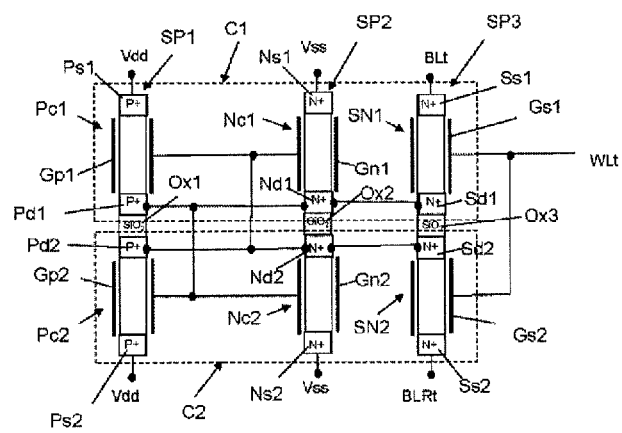
FIG. 1B is a schematic structural diagram of an SRAM cell for explaining the pillar-shaped semiconductor memory device including SGTs according to the first embodiment.

FIG. 1B illustrates a schematic structural diagram of the SRAM cell circuit according to the first embodiment. The SRAM cell circuit includes three Si pillars SP1, SP2, and SP3.

The Si pillar SP1 includes in its upper and lower parts the P-channel SGT Pc1 and the P-channel SGT Pc2 illustrated in FIG. 1A. The P-channel SGTs Pc1 and Pc2 are separated by a $SiO_2$ layer Ox1 disposed in a middle part of the Si pillar SP1. The P-channel SGT Pc1 is made up of a portion of the Si pillar SP1, the portion serving as a channel, a gate Gp1 that surrounds the portion of the Si pillar SP1, and a drain $P^+$ layer Pd1 and a source $P^+$ layer Ps1 disposed below and above the gate Gp1 in the Si pillar SP1. The P-channel SGT Pc2 is made up of a portion of the Si pillar SP1, the portion serving as a channel, a gate Gp2 that surrounds the portion of the Si pillar SP1, and a drain $P^+$ layer Pd2 and a source $P^+$ layer Ps2 disposed above and below the gate Gp2 in the Si pillar SP1.

The Si pillar SP2 includes in its upper and lower parts the N-channel SGT Nc1 and the N-channel SGT Nc2 illustrated in FIG. 1A. The N-channel SGTs Nc1 and Nc2 are separated by a $SiO_2$ layer Ox2 disposed in a middle part of the Si pillar SP2. The N-channel SGT Nc1 is made up of a portion of the Si pillar SP2, the portion serving as a channel, a gate Gn1 that surrounds the portion of the Si pillar SP2, and a drain $N^+$ layer Nd1 and a source $N^+$ layer Ns1 disposed below and above the gate Gn1 in the Si pillar SP2. The N-channel SGT Nc2 is made up of a portion of the Si pillar SP2, the portion serving as a channel, a gate Gn2 that surrounds the portion of the Si pillar SP2, and a drain W layer Nd2 and a source $N^+$ layer Ns2 disposed above and below the gate Gn2 in the Si pillar SP2.

The Si pillar SP3 includes in its upper and lower parts the N-channel SGT SN1 and the N-channel SGT SN2 illustrated in FIG. 1A. The N-channel SGTs SN1 and SN2 are separated by a $SiO_2$ layer Ox3 disposed in a middle part of the Si pillar SP3. The N-channel SGT SN1 is made up of a portion of the Si pillar SP3, the portion serving as a channel, a gate Gs1 that surrounds the portion of the Si pillar SP3, and a drain W layer Sd1 and a source W layer Ss1 disposed below and above the gate Gs1 in the Si pillar SP3. The N-channel SGT SN2 is made up of a portion of the Si pillar SP3, the portion serving as a channel, a gate Gs2 that surrounds the portion of the Si pillar SP3, and a drain $N^+$ layer Sd2 and a source $N^+$ layer Ss2 disposed above and below the gate Gs2 in the Si pillar SP3.

As illustrated in FIG. 1B, components of the Si pillars SP1, SP2, and SP3 located at the same height are connected to one another. Specifically, the gates Gp1 and Gn1 are connected to each other; the drain $P^+$ layer Pd1, the drain $N^+$ layer Nd1, and the drain $N^+$ layer Sd1 are connected to one another; the drain $P^+$ layer Pd2, the drain $N^+$ layer Nd2, and the drain $N^+$ layer Sd2 are connected to one another; and the gates Gp2 and Gn2 are connected to each other. Furthermore, the gates Gp1 and Gn1 are connected to the drain P layer Pd2, the drain $N^+$ layer Nd2, and the drain $N^+$ layer Sd2; and the gates Gp2 and Gn2 are connected to the drain $P^+$ layer Pd1, the drain $N^+$ layer Nd1, and the drain $N^+$ layer Sd1.

As illustrated in FIG. 1B, the source P+ layers Ps1 and Ps2 of the Si pillar SP1 are connected to a power supply terminal Vdd; the source N+ layers Ns1 and Ns2 of the Si pillar SP2 are connected to a ground terminal Vss; the source N+ layer Ss1 of the Si pillar SP3 is connected to a bit-line terminal BLt; the source N+ layer Ss2 of the Si pillar SP3 is connected to an inverted bit-line terminal BLRt; and the gates Gs1 and Gs2 of the Si pillar SP3 are connected to a word-line terminal WLt.

A first feature of this embodiment is that, as illustrated in FIG. 1B, the circuit region C1 in the circuit diagram illustrated in FIG. 1A is formed over the upper parts of the Si pillars SP1, SP2, and SP3, and the circuit region C2 is formed over the lower parts. A second feature is that components of the Si pillars SP1, SP2, and SP3 located at the same height are connected to one another not via connection paths between the upper and lower parts of the Si pillars. Specifically, the gates Gp1 and Gn1 are connected to each other not via connection paths between the upper and lower parts of the Si pillars SP1 and SP2; the drain P+ layer Pd1, the drain N+ layer Nd1, and the drain N+ layer Sd1 are connected to one another not via connection paths between the upper and lower parts of the Si pillars SP1, SP2, and SP3; the drain P+ layer Pd2, the drain N+ layer Nd2, and the drain N+ layer Sd2 are connected to one another not via connection paths between the upper and lower parts of the Si pillars SP1, SP2, and SP3; and likewise, the gates Gp2 and Gn2 are connected to each other not via connection paths between the upper and lower parts of the Si pillars SP1 and SP2.

Figure 2A:
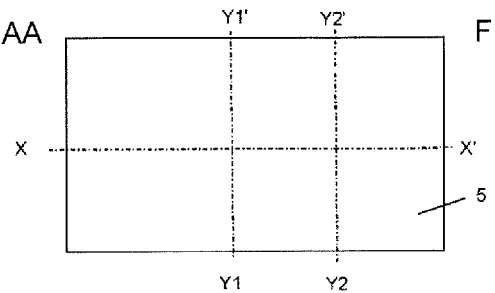
FIG. 2AA is a plan view for explaining a method for producing a pillar-shaped semiconductor memory device including SGTs according to the first embodiment.
Figure 2A:
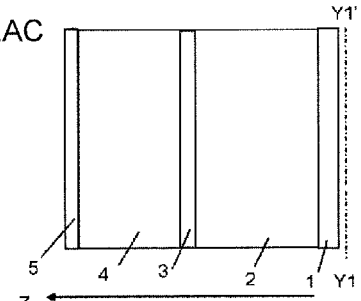
Figure 2A:
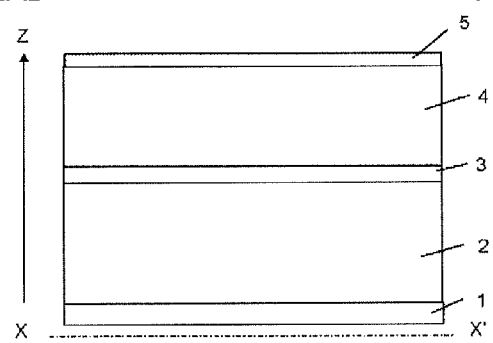
Figure 2A:
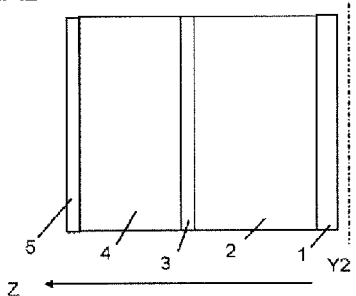

FIGS. 2AA to 2RD illustrate plan views and sectional views for explaining a process for producing a pillar-shaped semiconductor memory device including SGTs. Figures that end with the letter A illustrate plan views. Figures that end with the letter B illustrate sectional structural views taken along lines X-X' of the figures that end with the letter A. Figures that end with the letter C illustrate sectional structural views taken along lines Y1-Y1' of the figures that end with the letter A. Figures that end with the letter D illustrate sectional structural views taken along lines Y2-Y2' of the figures that end with the letter A.

As illustrated in FIGS. 2AA to 2AD, an i-layer 2, a SiO$_2$ layer 3, an i-layer 4, and a SiO$_2$ layer 5 are formed in layers on a SiO$_2$ layer substrate 1.

Figure 2B:
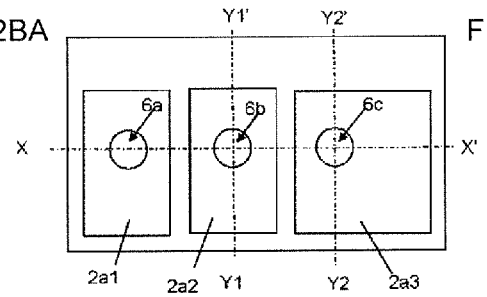
FIG. 2BA is a plan view for explaining the method for producing a pillar-shaped semiconductor memory device including SGTs according to the first embodiment.
Figure 2B:
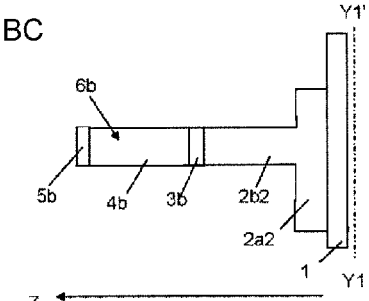
Figure 2B:
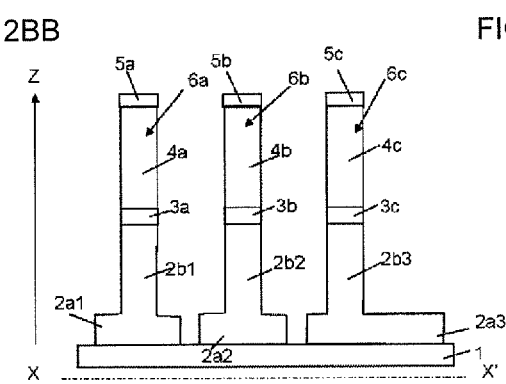
Figure 2B:
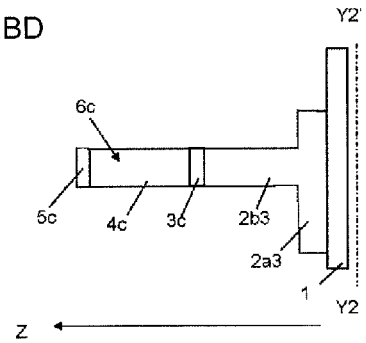

Next, as illustrated in FIGS. 2BA to 2BD, SiO$_2$ layers 5a, 5b, and 5c that are circular in plan view are formed by lithography and reactive ion etching (RIE) using a resist layer (not shown) as a mask. Next, the i-layer 4, the SiO$_2$ layer 3, and the i-layer 2 were etched by ME using the resist layer and the SiO$_2$ layers 5a, 5b, and 5c as masks to form Si pillars 6a, 6b, and 6c with lower parts of the i-layer 2 left on the SiO$_2$ layer substrate 1. Consequently, the Si pillar 6a includes an i-layer 2b1, a SiO$_2$ layer 3a, an i-layer 4a, and the SiO$_2$ layer 5a; the Si pillar 6b includes an i-layer 2b2, a SiO$_2$ layer 3b, an i-layer 4b, and the SiO$_2$ layer 5b; and the Si pillar 6c includes an i-layer 2b3, a SiO$_2$ layer 3c, an i-layer 4c, and the SiO$_2$ layer 5c.

Next, the remaining i-layer 2 was etched by lithography and RIE to form an i-layer 2a1 on the outer periphery of the Si pillar 6a, an i-layer 2a2 on the outer periphery of the Si pillar 6b, and an i-layer 2a3 on the outer periphery of the Si pillar 6c.

Next, as illustrated in FIGS. 2CA to 2CD, a SiO$_2$ layer 7a is formed on the outer peripheries of the Si pillar 6a and the i-layer 2a1, a SiO$_2$ layer 7b on the outer peripheries of the Si pillar 6b and the i-layer 2a2, and a SiO$_2$ layer 7c on the outer peripheries of the Si pillar 6c and the i-layer 2a3, by thermal oxidation, for example. Next, using lithography and ion implantation, a P+ layer 8a is formed in the i-layer 2a1 on the outer periphery of the Si pillar 6a, an N+ layer 8b in the i-layer 2a2 on the outer periphery of the Si pillar 6b, and an N+ layer 8c in the i-layer 2a3 on the outer periphery of the Si pillar 6c. Next, a SiO$_2$ layer 10 is formed so as to cover bottom parts of the Si pillars 6a, 6b, 6c, and the i-layers 2a1, 2a2, 2a3.

Next, as illustrated in FIGS. 2DA to 2DD, portions of the SiO$_2$ layers 7a, 7b, and 7c located above the SiO$_2$ layer 10 were removed, and then a hafnium oxide (HfO$_2$) layer 11 and a titanium nitride (TiN) layer 12 are sequentially formed so as to cover the Si pillars 6a, 6b, 6c, and the SiO$_2$ layer 10 by atomic layer deposition (ALD), for example. In a final product, the HfO$_2$ layer 11 serves as a gate insulating layer of an SGT, and the TiN layer 12 as a gate conductor layer of the SGT.

Next, as illustrated in FIGS. 2EA to 2ED, a TiN layer 12a covering the Si pillars 6a and 6b and a TiN layer 12b covering the Si pillar 6c are formed by lithography and RIE.

Next, as illustrated in FIGS. 2FA to 2FD, a SiO$_2$ layer 14 is formed so as to cover the entire surface. Next, heat treatment is performed to thermally diffuse acceptor impurity atoms in the P+ layer 8a, donor impurity atoms in the N+ layer 8b, and donor impurity atoms in the N+ layer 8c throughout the i-layers 2a1, 2a2, and 2a3, respectively, whereby a P+ layer 8aa, an N+ layer 8bb, and an N+ layer 8cc are formed. Next, a silicon nitride (SiN) layer 15 is formed so as to surround the Si pillars 6a, 6b, and 6c. Subsequently, a resist layer 16 is formed on the SiN layer 15. The resist layer 16 is formed such that the SiO$_2$ layers 3a, 3b, and 3c are located at an intermediate position along the height of the resist layer 16. The resist layer 16 is formed in such a manner that a resist material is applied to the Si pillars 6a, 6b, and 6c and to the upper surface of the SiN layer 15, and then heat-treated at 200° C., for example, to increase the flowability of the resist material so that the resist material is spread evenly on the SiN layer 15 at the outer sides of the Si pillars 6a, 6b, and 6c. Subsequently, hydrogen fluoride gas (hereinafter referred to as "HF gas") is fed to the whole structure. The resulting product is then heated at 180° C., for example, and as a result, the HF gas is ionized due to water in the resist layer 16 to form hydrogen fluoride ions (HF$_2^+$) (hereinafter referred to as "HF ions"). The HF ions diffuse throughout the resist layer 16 to etch portions of the SiO$_2$ layer 14 that are in contact with the resist layer 16 (with regard to the etching mechanism here, see Tadashi Shibata, Susumu Kohyama and Hisakazu Iizuka: "A New Field Isolation Technology for High Density MOS LSI", Japanese Journal of Applied Physics, Vol. 18, pp. 263-267 (1979)). By contrast, portions of the SiO$_2$ layer 14 that are not in contact with the resist layer 16 are mostly left without being etched off. Next, the resist layer 16 is removed.

Figure 2G:
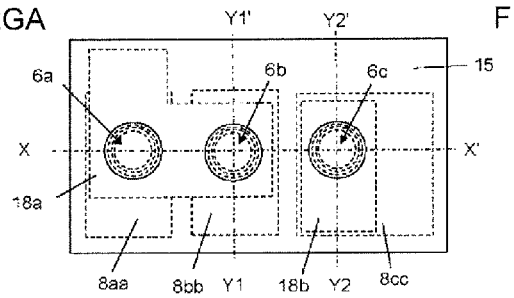
FIG. 2GA is a plan view for explaining the method for producing a pillar-shaped semiconductor memory device including SGTs according to the first embodiment.
Figure 2G:
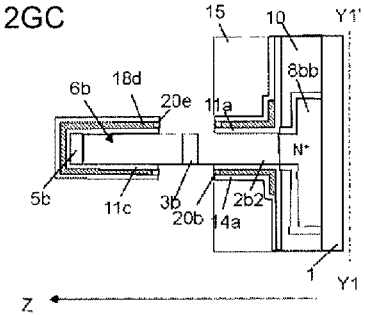
Figure 2G:
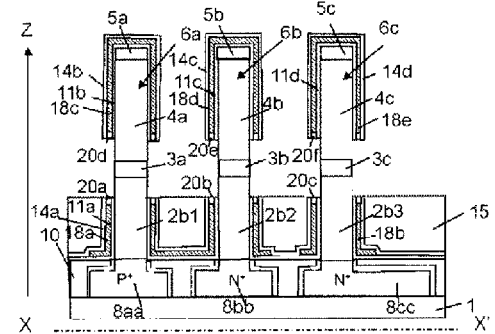
Figure 2G:
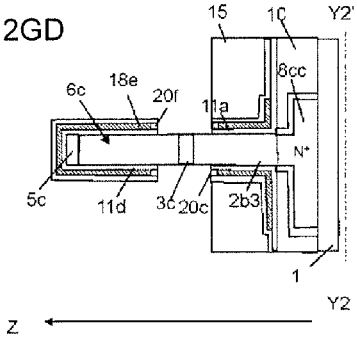

As a result of this process, as illustrated in FIGS. 2GA to 2GD, the SiO$_2$ layer 14 is divided into a SiO$_2$ layer 14a covered with the SiN layer 15, and SiO$_2$ layers 14b, 14c, and 14d in upper regions of the Si pillars 6a, 6b, and 6c. Subsequently, the TiN layers 12a and 12b are etched using the SiO$_2$ layers 14a, 14b, 14c, 14d, and the SiN layer 15 as masks. As a result, the TiN layer 12a is divided into a TiN layer 18a covered with the SiN layer 15 at lower regions of the Si pillars 6a and 6b, a TiN layer 18c covered with the SiO$_2$ layer 14b, and a TiN layer 18d covered with the SiO$_2$ layer 14c; and the TiN layer 12b is divided into a TiN layer 18b covered with the SiN layer 15 at a lower region of the Si pillar 6c, and a TiN layer 18e covered with the SiO$_2$ layer 14d. Next, the HfO$_2$ layer 11 is etched using the SiO$_2$ layers 14a, 14b, 14c, and the TiN layers 18a, 18b, 18c, 18d, 18e as masks. As a result, the HfO$_2$ layer 11 is divided into a HfO$_2$ layer 11a covered with the TiN layers 18a and 18b at lower regions of the Si pillars 6a, 6b, and 6c, and HfO$_2$ layers 11b, 11c, and 11d respectively covered with the TiN layers 18c, 18d, and 18e in upper regions of the Si pillars 6a, 6b, and 6c. Next, an exposed portion of the TiN layer 18a around the Si pillar 6a, an exposed portion of the TiN layer 18a around the Si pillar 6b, and exposed portions of the TiN layers 18b, 18c, 18d, and 18e are oxidized to form titanium oxide (TiO) layers 20a, 20b, 20c, 20d, 20e, and 20f.

Figure 2H:
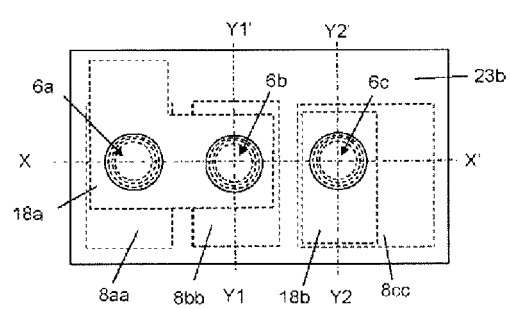
FIG. 2HA is a plan view for explaining the method for producing a pillar-shaped semiconductor memory device including SGTs according to the first embodiment.
Figure 2H:
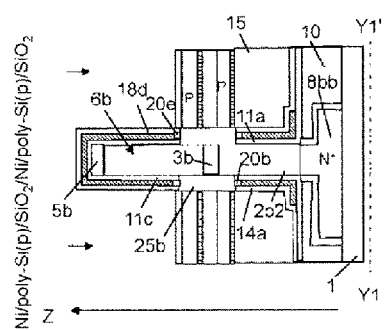
Figure 2H:
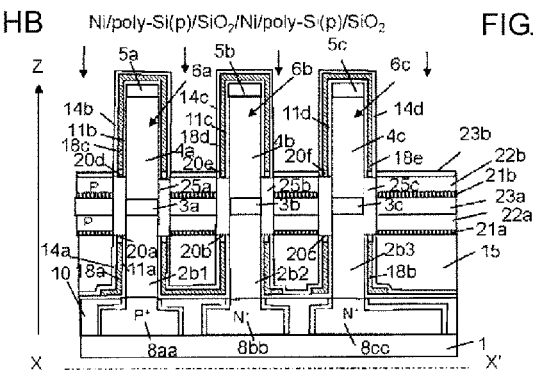
Figure 2H:
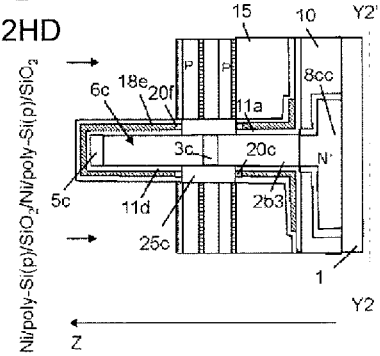

Next, as illustrated in FIGS. 2HA to 2HD, a Ni layer 21a is formed on the SiN layer 15 using bias sputtering by directing Ni atoms perpendicularly to the upper surface of the SiO$_2$ layer substrate 1. The bias sputtering is carried out, for example, as follows: a substrate metal plate on which the SiO$_2$ layer substrate 1 is disposed and a facing metal plate spaced from the substrate metal plate are provided; a direct voltage is applied to the substrate metal plate; and an RF high-frequency voltage is applied to these two parallel metal plates to sputter atoms constituting the facing metal plate and deposit the metal material on the SiO$_2$ layer substrate 1. Likewise, using the bias sputtering, a P-type poly-Si layer 22a containing a boron (B) impurity, a SiO$_2$ layer 23a, a Ni layer 21b, a P-type poly-Si layer 22b, and a SiO$_2$ layer 23b are sequentially stacked. The SiO$_2$ layer 23b is formed such that the upper surface thereof is in contact with the SiO$_2$ layers 14b, 14c, and 14d that respectively cover upper parts of the Si pillars 6a, 6b, and 6c. Since Ni atoms, poly-Si atoms, and SiO$_2$ atoms are directed perpendicularly to the upper surface of the SiO$_2$ layer substrate 1, enclosed spaces 25a, 25b, and 25c are respectively formed between the side surface of the Si pillar 6a and the Ni layers 21a, 21b, the P-type poly-Si layers 22a, 22b, and the SiO$_2$ layers 23a, 23b, between the side surface of the Si pillar 6b and these six layers, and between the side surface of the Si pillar 6c and these six layers. Next, multilayer films (not shown) are removed that have been formed atop the Si pillars 6a, 6b, and 6c simultaneously with the multilayer film composed of the Ni layers 21a, 21b, the P-type poly-Si layers 22a, 22b, and the SiO$_2$ layers 23a, 23b deposited on the SiN layer 15.

Figure 2I:
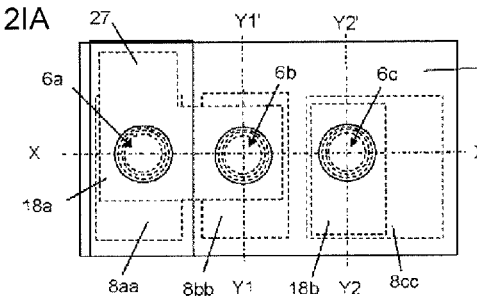
FIG. 2IA is a plan view for explaining the method for producing a pillar-shaped semiconductor memory device including SGTs according to the first embodiment.
Figure 2I:
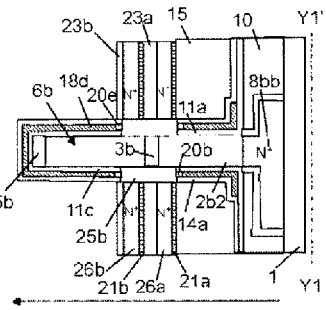
Figure 2I:
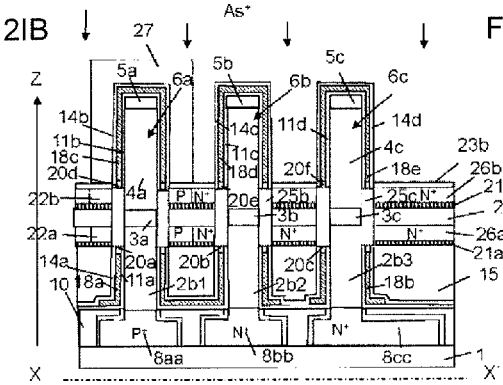
Figure 2I:
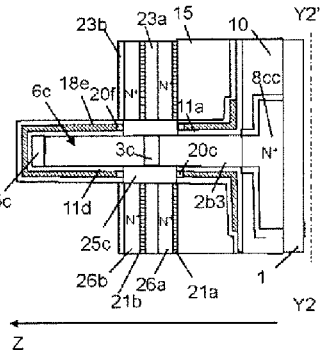

Next, as illustrated in FIGS. 2IA to 2ID, a resist layer 27 that covers the Si pillar 6a is formed. Next, the P-type poly-Si layer 22a on the outer periphery of the Si pillar 6b and the P-type poly-Si layer 22b on the outer periphery of the Si pillar 6c are each converted into an N$^+$ layer by arsenic (As) ion implantation from above the SiO$_2$ layer substrate 1 to thereby form N$^+$-type poly-Si layers 26a and 26b. The resist layer 27 is then removed.

Figure 2J:
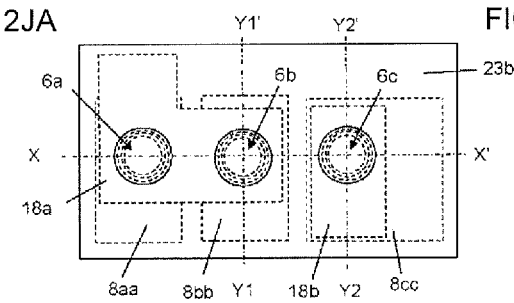
FIG. 2JA is a plan view for explaining the method for producing a pillar-shaped semiconductor memory device including SGTs according to the first embodiment.
Figure 2J:
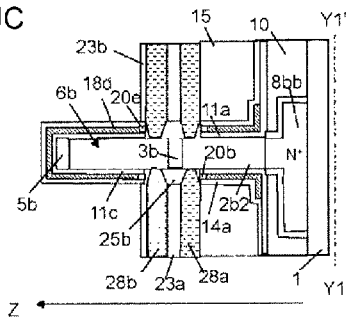
Figure 2J:
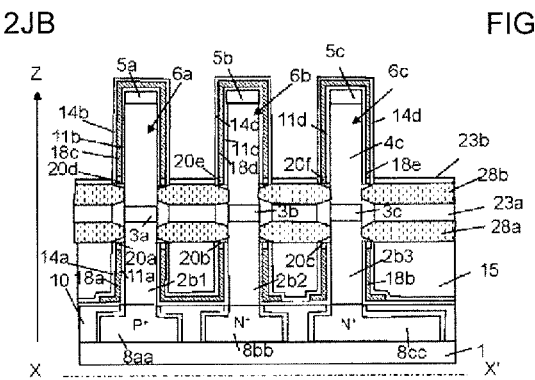
Figure 2J:
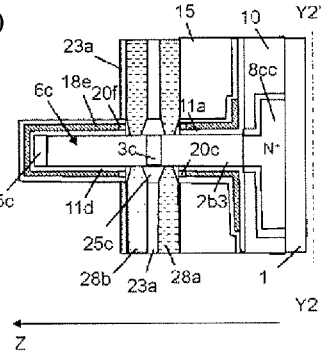

Next, as illustrated in FIGS. 2JA to 2JD, a heat treatment at 550° C., for example, is performed to diffuse Ni atoms in the Ni layer 21a into the P-type poly-Si layer 22a and the N$^+$-type poly-Si layer 26a, and to diffuse Ni atoms in the Ni layer 21b into the P-type poly-Si layer 22b and the N$^+$-type poly-Si layer 26b, whereby nickel silicide (NiSi) layers 28a and 28b are formed. The volume of the NiSi layer 28a is larger than the total volume of the P-type poly-Si layer 22a and the N$^+$-type poly-Si layer 26a, and the volume of the NiSi layer 28b is larger than the total volume of the P-type poly-Si layer 22b and the N$^+$-type poly-Si layer 26b (with regard to this volume expansion, see T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Since the P-type poly-Si layer 22a and the N$^+$-type poly-Si layer 26a are each sandwiched between the SiN layer 15 and the SiO$_2$ layer 23a, and the P-type poly-Si layer 22b and the N$^+$-type poly-Si layer 26b are each sandwiched between the SiO$_2$ layers 23a and 23b, the NiSi layers 28a and 28b expand mainly into the spaces 25a, 25b, and 25c. As atoms in the N$^+$-type poly-Si layer 26a and B atoms in the P-type poly-Si layer 22a are discharged outside the NiSi layer 28a, and As atoms in the N$^+$-type poly-Si layer 26b and B atoms in the P-type poly-Si layer 22b are discharged outside the NiSi layer 28b (with regard to the discharge phenomenon, see T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Due to the effect of discharging the impurity atoms, projections (not shown) including numbers of the impurity atoms are formed on side surfaces of the NiSi layers 28a and 28b expanded into the spaces 25a, 25b, and 25c, and the side surfaces of the projections come into contact with the surfaces of the Si pillars 6a, 6b, and 6c.

Figure 2K:
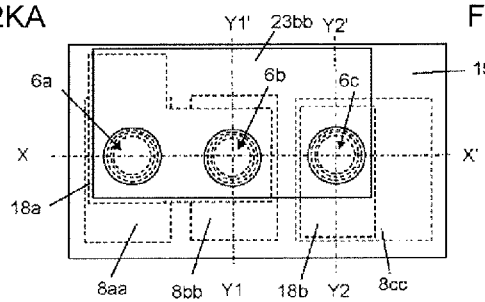
FIG. 2KA is a plan view for explaining the method for producing a pillar-shaped semiconductor memory device including SGTs according to the first embodiment.
Figure 2K:
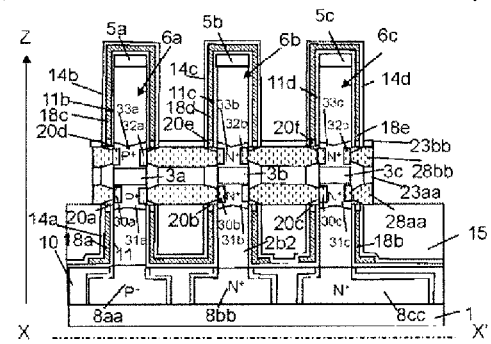
Figure 2K:
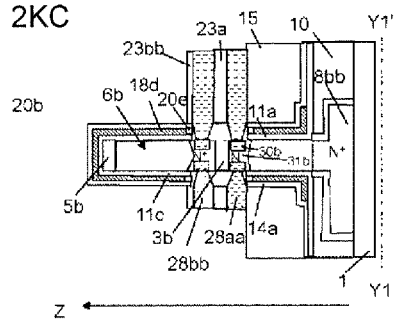
Figure 2K:
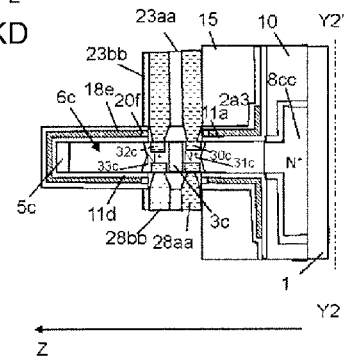

Next, as illustrated in FIGS. 2KA to 2KD, heat treatment is performed to promote the silicide formation in the NiSi layers 28a and 28b, and to exert the impurity discharge effect so that As atoms and B atoms are diffused from the projections respectively into the Si pillars 6b and 6c and into the Si pillar 6a. In this manner, NiSi layers 30a, 30b, and 30c are respectively formed on side surfaces of the Si pillars 6a, 6b, and 6c that are in contact with the NiSi layer 28a, while due to the impurity discharge effect, B atoms and As atoms are respectively diffused into the Si pillar 6a and into the Si pillars 6b and 6c, whereby a P$^+$ layer 31a, an N$^+$ layer 31b, and an N$^+$ layer 31c are respectively formed in the Si pillars 6a, 6b, and 6c. In the same manner, NiSi layers 32a, 32b, and 32c are respectively formed on side surfaces of the Si pillars 6a, 6b, and 6c that are in contact with the NiSi layer 28b, while due to the impurity discharge effect, B atoms and As atoms are respectively diffused into the Si pillar 6a and into the Si pillars 6b and 6c, whereby a P$^+$ layer 33a, an N$^+$ layer 33b, and an N$^+$ layer 33c are respectively formed in the Si pillars 6a, 6b, and 6c. In the SiO$_2$ layers 3a, 3b, and 3c, neither the thermal diffusion of the donor and acceptor impurity atoms nor the silicide formation occurs, and thus the P$^+$ layer 31a and the P$^+$ layer 33a, the N$^+$ layer 31b and the N$^+$ layer 33b, and the P$^+$ layer 31c and the N$^+$ layer 33c are respectively separated by the SiO$_2$ layers 3a, 3b, and 3c. Next, the NiSi layers 28a, 28b, and the SiO$_2$ layers 23a, 23b are patterned by lithography and RIE such that they remain on the outer peripheries of the Si pillars 6a, 6b, and 6c to thereby form NiSi layers 28aa, 28bb, and SiO$_2$ layers 23aa, 23bb.

Figure 2L:
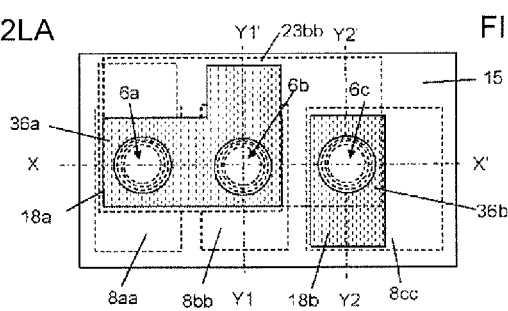
FIG. 2LA is a plan view for explaining the method for producing a pillar-shaped semiconductor memory device including SGTs according to the first embodiment.
Figure 2L:
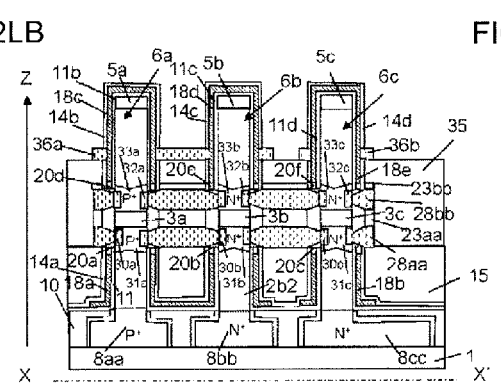
Figure 2L:
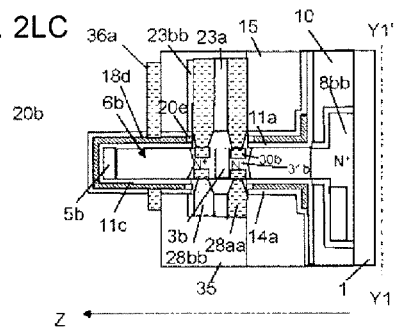
Figure 2L:
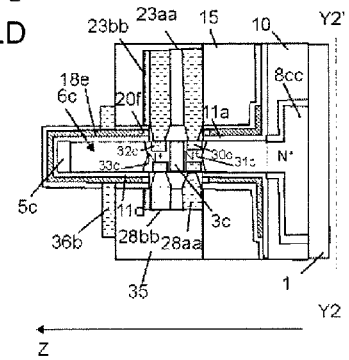

Next, as illustrated in FIGS. 2LA to 2LD, a SiN layer 35 is formed such that the upper surface thereof is located at an intermediate position along the height of the TiN layers 18c, 18d, and 18e by using the same method as used to form the SiN layer 15. Subsequently, openings are formed on the outer peripheries of the TiN layers 18c, 18d, and 18e by using the same method as used to form the spaces 25a, 25b, and 25c. Subsequently, a NiSi layer 36a in contact with the TiN layers 18c and 18d and a NiSi layer 36b in contact with the TiN layer 18e are formed.

Figure 2M:
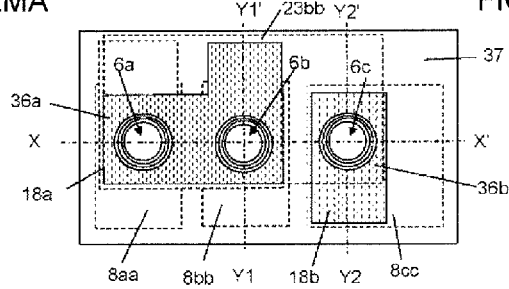
FIG. 2MA is a plan view for explaining the method for producing a pillar-shaped semiconductor memory device including SGTs according to the first embodiment.
Figure 2M:
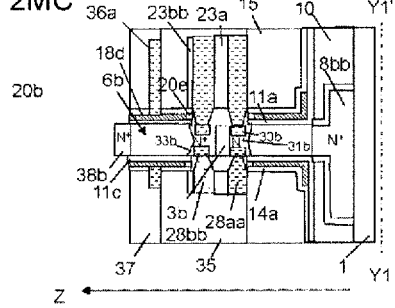
Figure 2M:
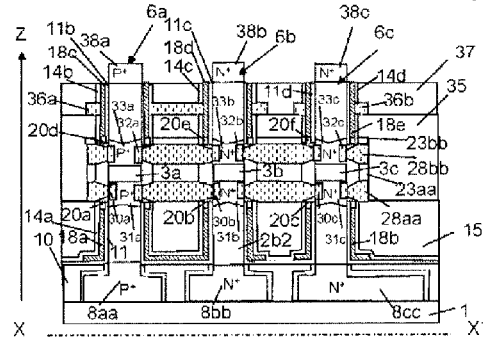
Figure 2M:
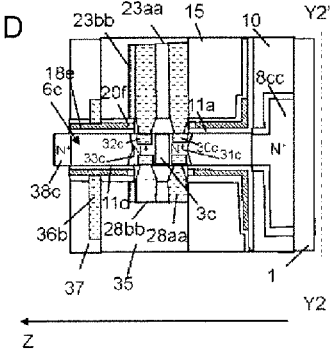

Next, as illustrated in FIGS. 2MA to 2MD, a SiO$_2$ layer 37 is formed such that the upper surface thereof is located above the upper surfaces of the NiSi layer 36a and 36b and below the tops of the Si pillars 6a, 6b, and 6c. Next, using the SiO$_2$ layer 37 as a mask, the SiO$_2$ layer 14b, the TiN layer 18c, and the HfO$_2$ layer 11b on the top of the Si pillars 6a, the SiO$_2$ layer 14c, the TiN layers 18d, and the HfO$_2$ layer 11c on the top of the Si pillars 6b, and the SiO$_2$ layer 14d, the TiN layers 18e, and the HfO$_2$ layer 11d on the top of the Si pillars 6c are etched. Next, by lithography and ion implantation using the SiO$_2$ layers 37, 14b, 14c, 14d, the TiN layers 18c, 18d, 18e, and the HfO$_2$ layers 11b, 11c, 11d as masks, boron (B) ions are implanted into the top of the Si pillar 6a to form a P$^+$ layer 38a, and arsenic (As) ions are implanted into the tops of the Si pillars 6b and 6c to respectively form N$^+$ layers 38b and 38c.

Figure 2N:
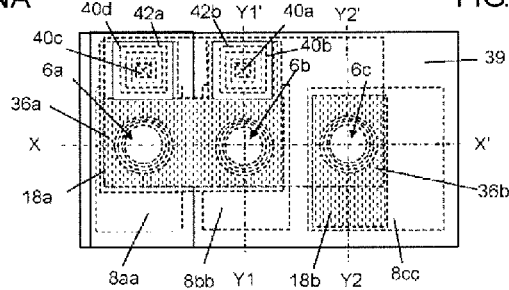
FIG. 2NA is a plan view for explaining the method for producing a pillar-shaped semiconductor memory device including SGTs according to the first embodiment.
Figure 2N:
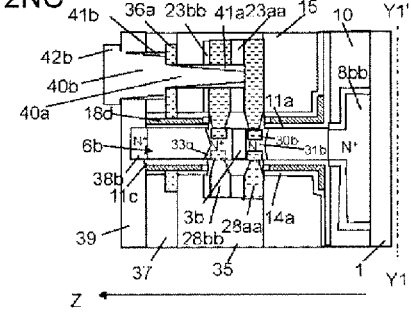
Figure 2N:
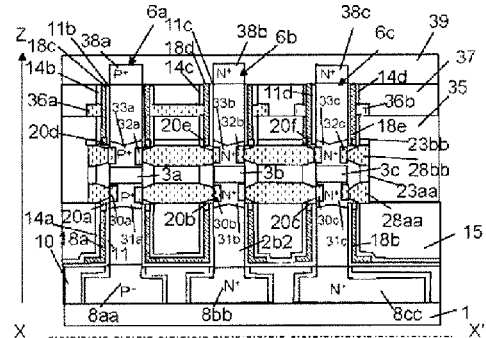
Figure 2N:
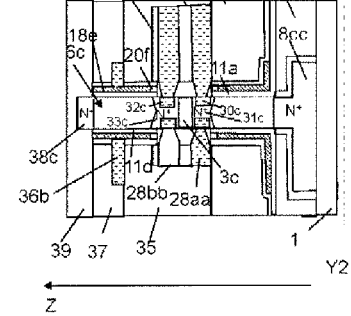

Next, as illustrated in FIGS. 2NA to 2ND, a SiO$_2$ layer 39 is formed over the entire surface by CVD and MCP. Subsequently, a contact hole 40a is formed by lithography and RIE so as to extend through the SiO$_2$ layers 39, 37, the NiSi layer 36a, the SiN layer 35, the SiO$_2$ layer 23bb, the NiSi layer 28bb, and the SiO$_2$ layer 23aa to the NiSi layer 28aa. Next, a contact hole 40b united with the contact hole 40a is formed so as to extend through the SiO$_2$ layers 39 and 37 surrounding the contact hole 40a to the NiSi layer 36a. Next, a SiO$_2$ film (not shown), for example, is deposited on the entire surface by ALD, and then the entire surface is etched by RIE to remove the SiO$_2$ film on the NiSi layer 28aa at the bottom of the contact hole 40a and on the NiSi layer 36a at the bottom of the contact hole 40b. As a result, a SiO$_2$ layer 41a is formed on the inner side surface of the contact hole 40a; likewise, a SiO$_2$ layer 41b is formed on the inner side surface of the contact hole 40b. Next, a wiring metal layer 42b that connects the NiSi layer 28aa to the NiSi layer 36a is formed. Furthermore, using the same method as for the connection of the NiSi layer 28aa to the NiSi layer 36a via the wiring metal layer 42b, the TiN layer 18a and the NiSi layer 28bb are connected to each other through a wiring metal layer 42a via contact holes 40c and 40d formed.

Figure 2P:
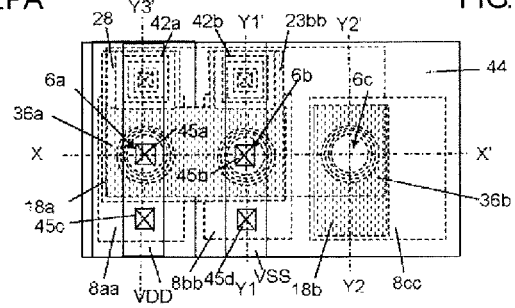
FIG. 2PA is a plan view for explaining the method for producing a pillar-shaped semiconductor memory device including SGTs according to the first embodiment.
Figure 2P:
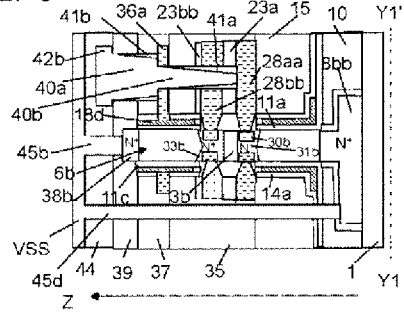
Figure 2P:
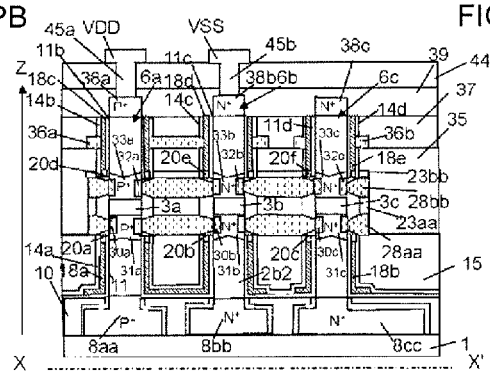
Figure 2P:
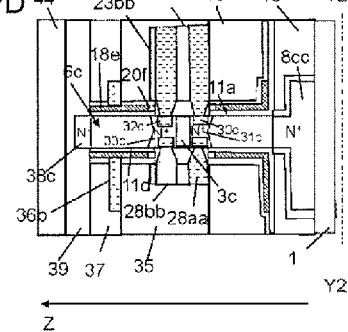

Next, as illustrated in FIGS. 2PA to 2PD, a SiO$_2$ layer 44 is formed on the entire surface. Next, a contact hole 45a is formed so as to extend through the SiO$_2$ layers 44 and 39 to the P$^+$ layer 38a at the top of the Si pillar 6a. A contact hole 45b is formed so as to extend through the SiO$_2$ layers 44 and 39 to the N$^+$ layer 38b at the top of the Si pillar 6b. A contact hole 45c is formed so as to extend through the SiO$_2$ layers 44 and 39 to the P$^+$ layer 8aa. A contact hole 45d is formed so as to extend through the SiO$_2$ layers 44 and 39 to the N$^+$ layer 8bb. Next, a power supply wiring metal layer VDD is formed that is connected to the P$^+$ layer 38a via the contact hole 45a and to the P$^+$ layer 8aa via the contact hole 45c, and that extends along line Y3-Y3' in plan view. Furthermore, a ground wiring metal layer VSS is formed that is connected to the N$^+$ layer 38b via the contact hole 45b and to the N$^+$ layer 8bb via the contact hole 45d, and that extends along line Y1-Y1' in plan view.

Figure 2Q:
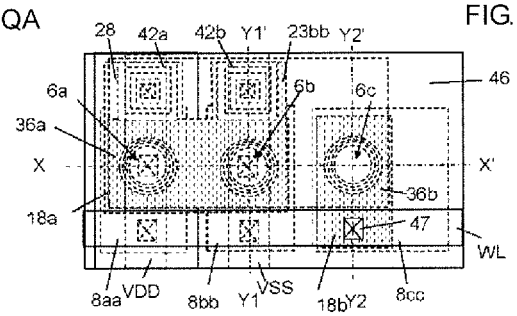
FIG. 2QA is a plan view for explaining the method for producing a pillar-shaped semiconductor memory device including SGTs according to the first embodiment.
Figure 2Q:
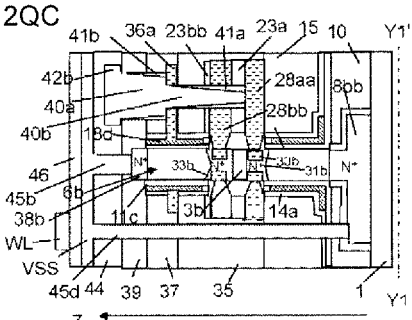
Figure 2Q:
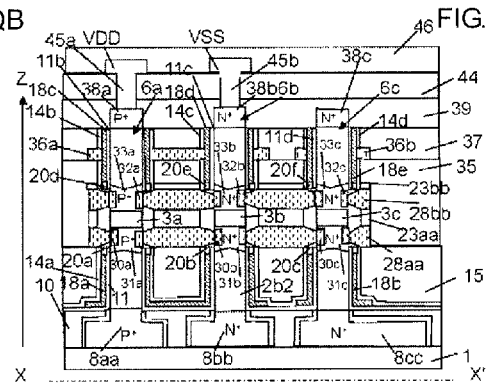
Figure 2Q:
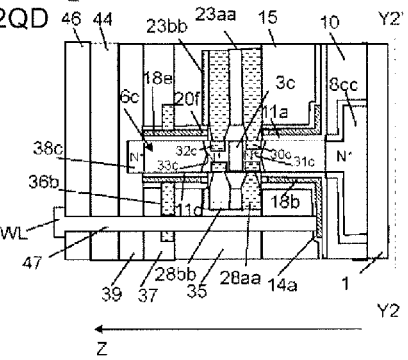

Next, as illustrated in FIGS. 2QA to 2QD, a SiO$_2$ layer 46 is formed on the entire surface. Next, a contact hole 47 is formed so as to extend through the SiO$_2$ layers 46, 44, 39, 37, the NiSi layer 36b, the SiN layers 35, 15, and the SiO$_2$ layer 14a to the TiN layer 18b. Next, a word-line wiring metal layer WL is formed that connects the TiN layer 18b to the NiSi layer 36b via the contact hole 47 and extends along line X-X'.

Next, as illustrated in FIGS. 2RA to 2RD, a SiO$_2$ layer 48 is formed on the entire surface. Next, a contact hole 49a is formed so as to extend through the SiO$_2$ layers 48, 46, 44, and 39 to the N$^+$ layer 38c at the top of the Si pillar 6c, and a contact hole 49b is formed so as to extend through the SiO$_2$ layers 48, 46, 44, 39, 37, the SiN layers 35, 15, the SiO$_2$ layer 14a, the HfO$_2$ layer 11a, and the SiO$_2$ layers 10, 7c to the N$^+$ layer 8cc. Next, a bit-line wiring metal layer BL is formed that is connected to the N$^+$ layer 38c via the contact hole 49a and that extends along line Y1-Y1' in plan view, and an inverted bit-line wiring metal layer BLR is formed that is connected to the N$^+$ layer 8cc via the contact hole 49b and that extends along line Y1-Y1' in plan view.

As illustrated in FIGS. 2RA to 2RD, an SGT (corresponding to the P-channel SGT Pc1 in FIG. 1B) including the P$^+$ layer 33a, serving as a drain, the P$^+$ layer 38a, serving as a source, the TiN layer 18c, serving as a gate, and a portion of the Si pillar 6a between the P$^+$ layers 33a and 38a, serving as a channel, is formed in the upper part of the Si pillar 6a, and an SGT (corresponding to the P-channel SGT Pc2 in FIG. 1B) including the P$^+$ layer 8aa, serving as a source, the P$^+$ layer 31a, serving as a drain, the TiN layer 18a, serving as a gate, and a portion of the Si pillar 6a between the P$^+$ layers 8aa and 31a, serving as a channel, is formed in the lower part of the Si pillar 6a.

An SGT (corresponding to the N-channel SGT Nc1 in FIG. 1B) including the N$^+$ layer 38b, serving as a source, the N$^+$ layer 33b, serving as a drain, the TiN layer 18d, serving as a gate, and a portion of the Si pillar 6b between the N$^+$ layers 38b and 33b, serving as a channel, is formed in the upper part of the Si pillar 6b, and an SGT (corresponding to the N-channel SGT Nc2 in FIG. 1B) including the N$^+$ layer 8bb, serving as a source, the N$^+$ layer 31b, serving as a drain, the TiN layer 18a, serving as a gate, and a portion of the Si pillar 6a between the N$^+$ layers 8bb and 31b, serving as a channel, is formed in the lower part of the Si pillar 6b.

An SGT (corresponding to the N-channel SGT SN1 in FIG. 1B) including the N$^+$ layer 38c, serving as a source, the N$^+$ layer 33c, serving as a drain, the TiN layer 18e, serving as a gate, and a portion of the Si pillar 6c between the N$^+$ layers 38c and 33c, serving as a channel, is formed in the upper part of the Si pillar 6c, and an SGT (corresponding to the N-channel SGT Nc2 in FIG. 1B) including the N$^+$ layer 8cc, serving as a source, the N$^+$ layer 31c, serving as a drain, the TiN layer 18b, serving as a gate, and a portion of the Si pillar 6c between the N$^+$ layers 8cc and 31c, serving as a channel, is formed in the lower part of the Si pillar 6c.

These SGTs (corresponding to the SGTs Pc1, Pc2, Nc1, Nc2, SN1, and SN2 in FIG. 1B) are connected through wires to form an SRAM cell circuit including, similarly to the schematic structural diagram illustrated in FIG. 1B, a circuit region (corresponding to the circuit region C1 in FIG. 1B) that includes a P-channel SGT (corresponding to the P-channel SGT Pa in FIG. 1B) and N-channel SGTs (corresponding to the N-channel SGTs Nc1 and SN1 in FIG. 1B) formed in the upper parts of the Si pillars 6a, 6b, and 6c, and a circuit region (corresponding to the circuit region C2 in FIG. 1B) that includes a P-channel SGT (corresponding to the P-channel SGT Pc2 in FIG. 1B) and N-channel SGTs (corresponding to the N-channel SGTs Nc2 and SN2 in FIG. 1B) formed in the lower parts of the Si pillars 6a, 6b, and 6c.

The pillar-shaped semiconductor memory device and the method for producing the device according to the first embodiment have the following effects.

1. As illustrated in FIG. 1B and FIGS. 2RA to 2RD, one feature of this embodiment is that in the C1 circuit region, the gate TiN layer 18c of the Si pillar 6a and the gate TiN layer 18d of the Si pillar 6b are connected to each other not via a contact hole formed in a Z direction (the direction perpendicular to the surface of the SiO$_2$ layer substrate 1) but via the NiSi layer 36a at the same height, and the P$^+$ layer 33a of the Si pillar 6a, the N$^+$ layer 33b of the Si pillar 6b, and the N$^+$ layer 33c of the Si pillar 6c are connected to one another not via a contact hole formed in the Z direction but via the NiSi layer 28bb. Similarly, in the C2 circuit region, the P+ layer 31a of the Si pillar 6a, the N+ layer 31b of the Si pillar 6b, and the N+ layer 31c of the Si pillar 6c are connected to one another not via a contact hole formed in the Z direction but via the NiSi layer 28aa, and the gate TiN layer 18a of the Si pillar 6a and the gate TiN layer 18a of the Si pillar 6b are connected to each other not via a contact hole formed in the Z direction. This configuration can provide a high-density SRAM cell circuit including SGTs.

2. As illustrated in FIG. 2RA, the SRAM cell circuit region according to this embodiment, when viewed in plan, includes the three Si pillars 6a, 6b, and 6c and the nine contact holes 40b (which is formed so as to overlap the contact hole 40a), 40c (which is formed so as to overlap the contact hole 40d), 45a, 45b, 45c, 45d, 47, 49a, and 49b. When one SGT is formed in one semiconductor pillar, contacts (connections via contact holes) with at least three wiring metal layer, namely, a source, a drain, and a gate, is typically required. In this embodiment, however, although two SGTs are formed in one semiconductor pillar (Si pillar), an SRAM cell circuit is formed with three contacts per semiconductor pillar. This configuration can provide a high-density SRAM cell circuit including SGTs.

3. In the SRAM cell circuit according to this embodiment, the Si pillar 6a (corresponding to SP1 in FIG. 1B) including P-channel SGTs corresponding to the load transistor P-channel SGTs Pc1 and Pc2, and the Si pillar 6b (corresponding to SP2 in FIG. 1B) including N-channel SGTs corresponding to the drive transistor N-channel SGTs Nc1 and Nc2 are formed adjacent to each other. This configuration can avoid an increase in the area of the SRAM cell circuit region. Such an increase can be caused when the Si pillar 6c (corresponding to SP3 in FIG. 1B) including N-channel SGTs corresponding to the selection transistor N-channel SGTs SN1 and SN2 is formed between the Si pillar 6a and the Si pillar 6b, because the TiN layer 18a and the NiSi layer 36a connected to the outer peripheries of the Si pillars 6a and 6b need to be formed such that these layers, when viewed in plan, detour the TiN layer 18b and the NiSi layer 36b connected to the outer periphery of the Si pillar 6c.

Second Embodiment

A method for producing a pillar-shaped semiconductor memory device including SGTs according to a second embodiment of the present invention will now be described with reference to FIGS. 3AA to 3EE. Figures that end with the letter A are plan views. Figures that end with the letter B are sectional structural views taken along lines X-X' of the figures that end with the letter A. Figures that end with the letter C are sectional structural views taken along lines Y1-Y1' of the figures that end with the letter A. Figures that end with the letter D are sectional structural views taken along lines Y2-Y2' of the figures that end with the letter A. Figures that end with the letter E are sectional structural views taken along lines Y3-Y3' of the figures that end with the letter A. The production method according to the second embodiment includes the same process as illustrated in FIGS. 2AA to 2RD of the first embodiment except that there are structural differences described below.

FIGS. 3AA to 3AD correspond to the process of FIGS. 2EA to 2ED of the first embodiment. As illustrated in FIGS. 3AA to 3AD, the shape in plan view of an i-layer 50 connected to the lower part of the Si pillar 6c is shorter in the direction of line X-X' and longer in the direction of line Y2-Y2' compared with the shape of the i-layer 2a3 in FIG. 2EA. The shape in plan view of a TiN layer 51 that covers the Si pillars 6a and 6b is longer in the direction of line Y3-Y3' crossing the Si pillar 6a compared with the shape of the TiN layer 12a in FIG. 2EA.

Figure 3B:
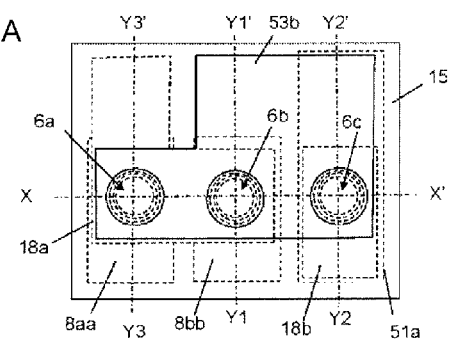
FIG. 3BA is a plan view for explaining the method for producing a pillar-shaped semiconductor memory device including SGTs according to the second embodiment.
Figure 3B:
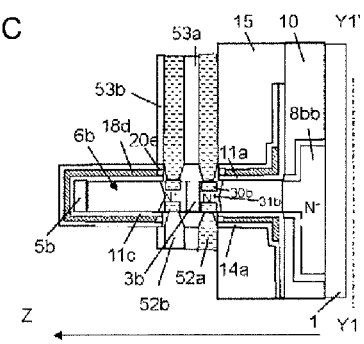
Figure 3B:
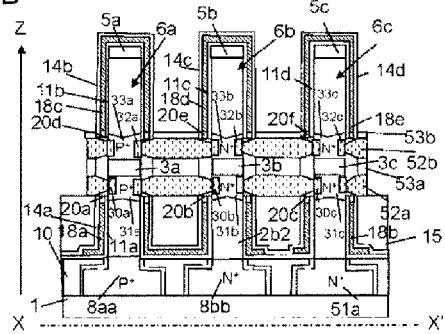
Figure 3B:
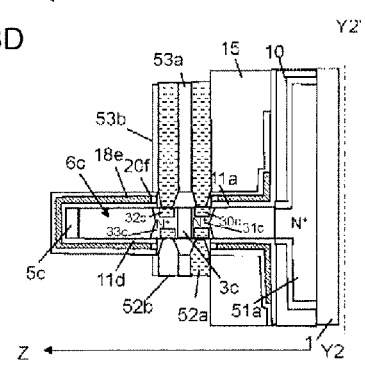

FIGS. 3BA to 3BD correspond to the process of FIGS. 2KA to 2KD of the first embodiment. As illustrated in FIGS. 3BA to 3BD, the shape in plan view of NiSi layers 52a, 52b, and SiO$_2$ layers 53a, 53b formed by lithography and RIE is shorter, as compared with FIG. 2KA, in the upper part in the direction of line Y3-Y3' crossing the Si pillar 6a.

Figure 3C:
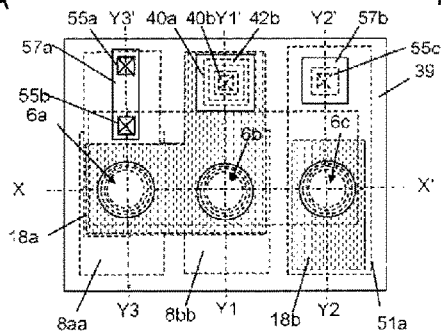
FIG. 3CA is a plan view for explaining the method for producing a pillar-shaped semiconductor memory device including SGTs according to the second embodiment.
Figure 3C:
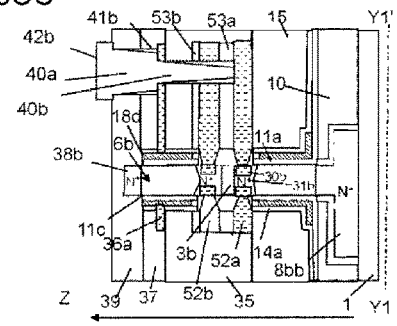
Figure 3C:
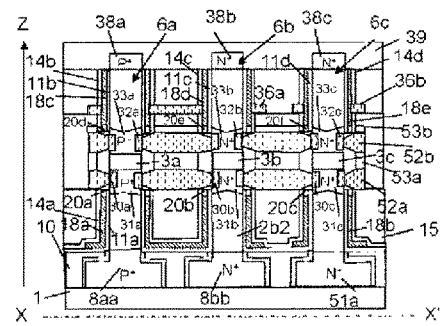
Figure 3C:
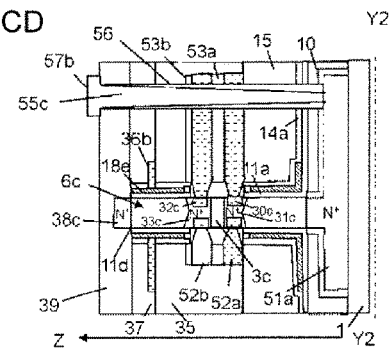
Figure 3C:
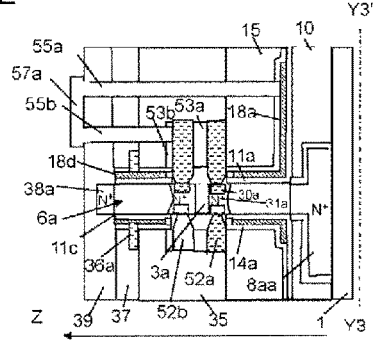

FIGS. 3CA to 3CE correspond to the process of FIGS. 2NA to 2ND of the first embodiment. As illustrated in FIGS. 3CA to 3CE, contact holes 55a, 55b, and 55c are formed in addition to the contact holes 40a and 40b overlapping each other in FIGS. 2NA to 2ND. The contact hole 55a is formed so as to extend through the SiO$_2$ layers 39, 37, and the SiN layers 35, 15 to the TiN layer 18a. The contact hole 55b is formed so as to extend through the SiO$_2$ layers 39, 37, the SiN layer 35, and the SiO$_2$ layer 53b to the NiSi layer 52b. Next, a wiring metal layer 57a is formed that connects the TiN layer 18a to the NiSi layer 52b via the contact holes 55a and 55b. The contact hole 55c is formed so as to extend through the SiO$_2$ layers 39, 37, the SiN layer 35, the SiO$_2$ layer 53b, the NiSi layer 52b, the SiO$_2$ layer 53a, the NiSi layer 52a, the SiN layer 15, the SiO$_2$ layer 14a, the HfO$_2$ layer 11a, and the SiO$_2$ layers 10, 7c to an N+ layer 51a. Next, a SiO$_2$ film (not shown) is deposited on the entire surface, and then the entire surface is etched by RIE to form a SiO$_2$ layer 56 on the inner side surface of the contact hole 55c. Next, a wiring metal layer 57b is formed that is connected to the N+ layer 51a via the contact hole 55c. The wiring metal layer 57b is insulated from the NiSi layers 52a and 52b by the SiO$_2$ layer 56.

Figure 3D:
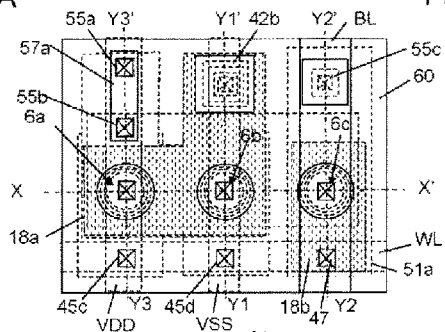
FIG. 3DA is a plan view for explaining the method for producing a pillar-shaped semiconductor memory device including SGTs according to the second embodiment.
Figure 3D:
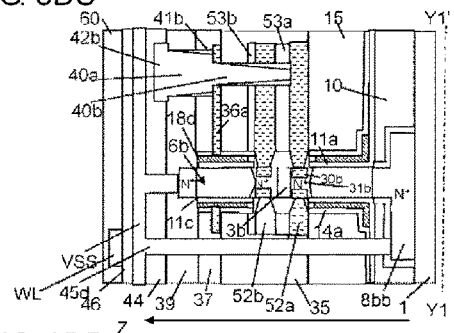
Figure 3D:
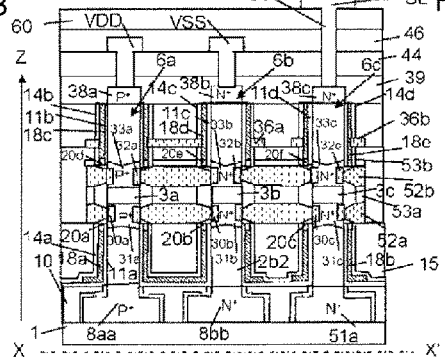
Figure 3D:
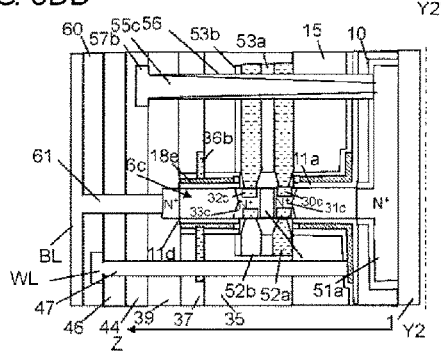
Figure 3D:
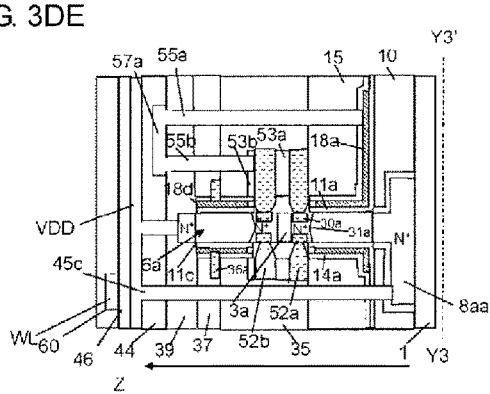

FIGS. 3DA to 3DE correspond to the process of FIGS. 2RA to 2RD of the first embodiment. As illustrated in FIGS. 3DA to 3DE, a contact hole 61 is formed so as to extend through a SiO$_2$ layer 60, and the SiO$_2$ layers 46, 44, 39 to the Si pillar 6c. Next, a bit-line wiring metal layer BL is formed that is connected to the N+ layer 38c via the contact hole 61.

Figure 3E:
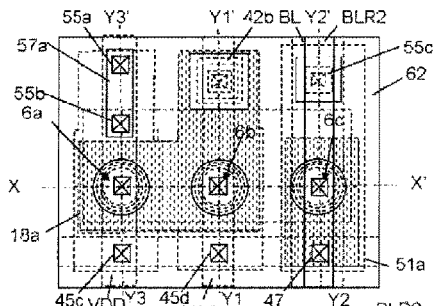
FIG. 3EA is a plan view for explaining the method for producing a pillar-shaped semiconductor memory device including SGTs according to the second embodiment.
Figure 3E:
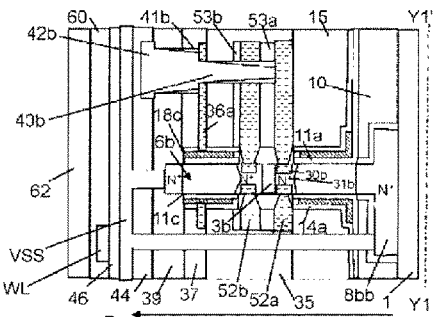
Figure 3E:
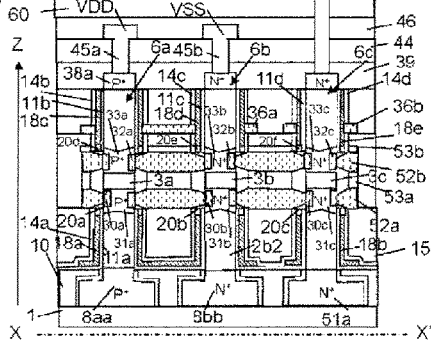
Figure 3E:
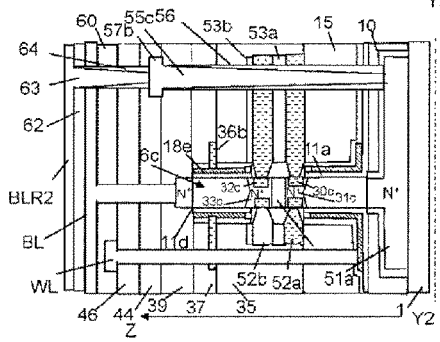
Figure 3E:
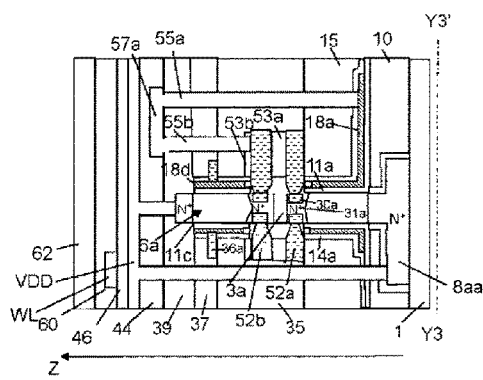

Next, as illustrated in FIGS. 3EA to 3EE, a SiO$_2$ layer 62 is formed on the entire surface. Next, as illustrated in FIG. 3ED, a contact hole 63 is formed so as to extend through the bit-line wiring metal layer BL, and the SiO$_2$ layers 62, 60, 46, 44 to the wiring metal layer 57b. Next, a SiO$_2$ film (not shown) is deposited on the entire surface by ALD, for example, and then the entire surface is etched by RIE to remove the SiO$_2$ film on the wiring metal layer 57b, whereby a SiO$_2$ layer 64 is formed on the inner side surface of the contact hole 63. Next, an inverted bit-line wiring metal layer BLR2 is formed that is connected to the wiring metal layer 57b via the contact hole 63. In this manner, an SRAM cell circuit having the same structure as illustrated in the schematic structural diagram of FIG. 1B of the first embodiment is formed on the SiO$_2$ layer substrate 1.

In the first embodiment, the inverted bit-line wiring metal layer BLR, when viewed in plan, is in parallel with the bit-line wiring metal layer BL, but in the second embodiment, the inverted bit-line wiring metal layer BLR2 overlaps the bit-line wiring metal layer BL. This configuration provides an SRAM cell region with a reduced area. In addition, in the second embodiment, the NiSi layer 52b and the TiN layer 18a are connected to each other through the wiring metal layer 57a via the contact hole 55a extending to the TiN layer 18a and the contact hole 55b. The contact holes 55a and 55b require no formation of SiO$_2$ layers, although the contact holes 40c and 40d illustrated in FIG. 2NA of the first embodiment require the formation of SiO$_2$ layers on the inner side surfaces of the contact holes for insulation from the NiSi layer 28*bb*. This configuration facilitates the production of an SRAM cell.

Third Embodiment

Figure 4A:
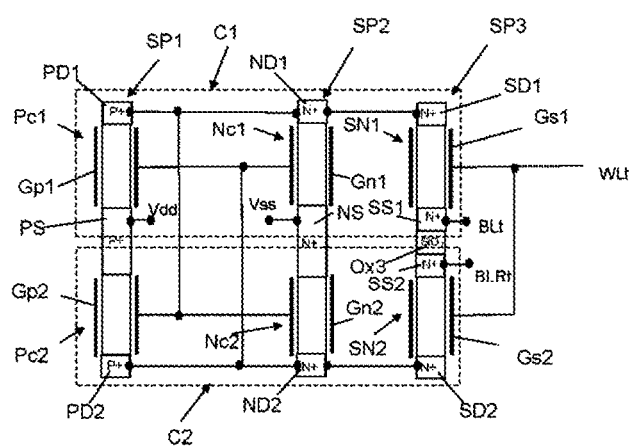
FIG. 4A is a schematic structural diagram of a cell for explaining a pillar-shaped semiconductor memory device including SGTs according to a third embodiment of the present invention.
Figure 4B:
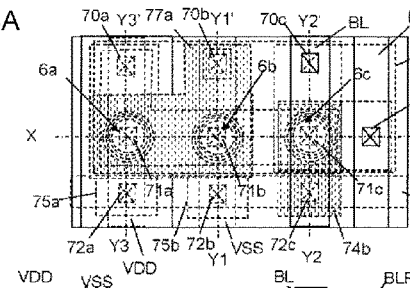
FIG. 4BA is a plan view for explaining a method for producing a pillar-shaped semiconductor memory device including SGTs according to the third embodiment.
Figure 4B:
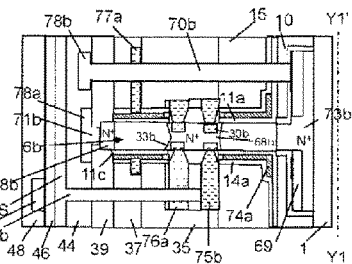
Figure 4B:
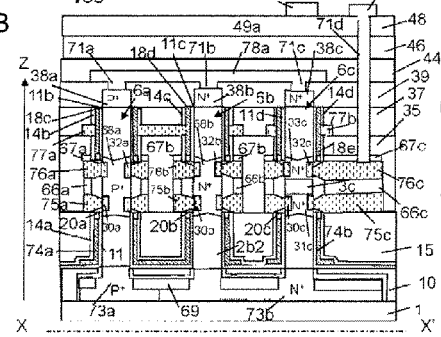
Figure 4B:
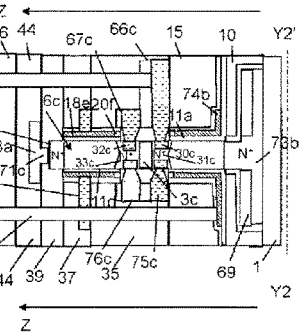
Figure 4B:
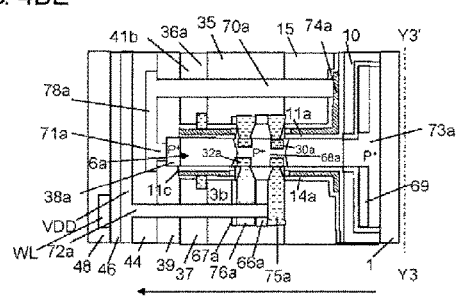
Figure 4C:
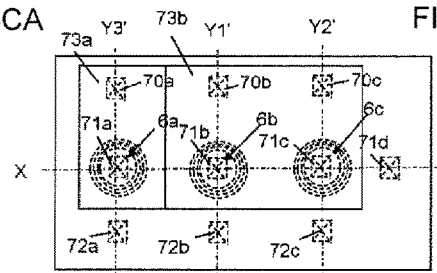
FIGS. 4CA to 4CI are plan views for explaining the method for producing a pillar-shaped semiconductor memory device including SGTs according to the third embodiment.
Figure 4C:
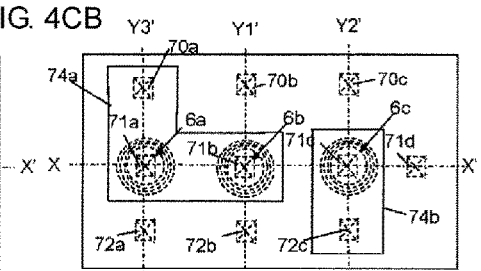
Figure 4C:
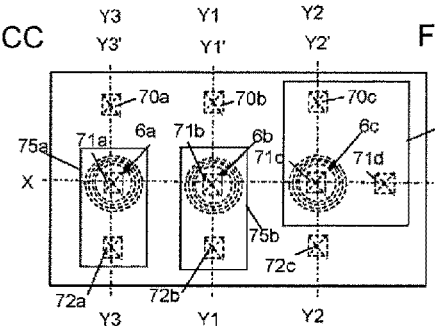
Figure 4C:
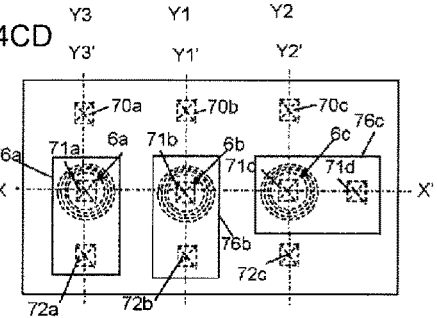
Figure 4C:
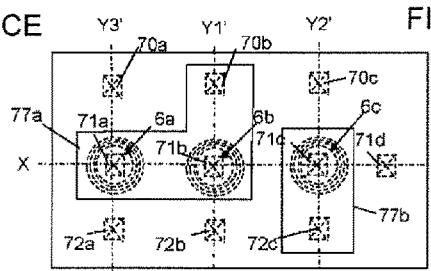
Figure 4C:
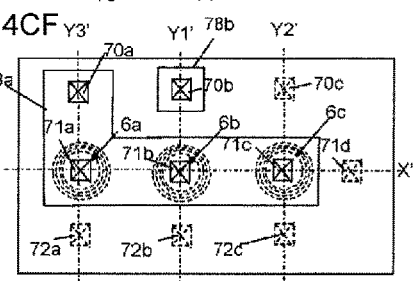
Figure 4C:
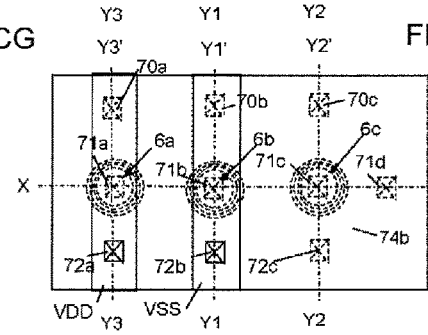
Figure 4C:
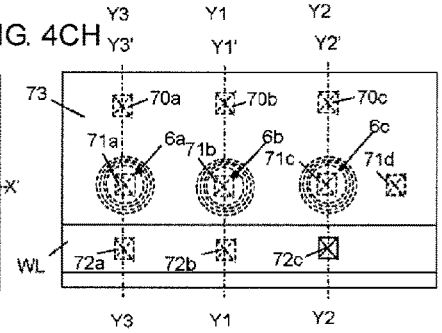
Figure 4C:
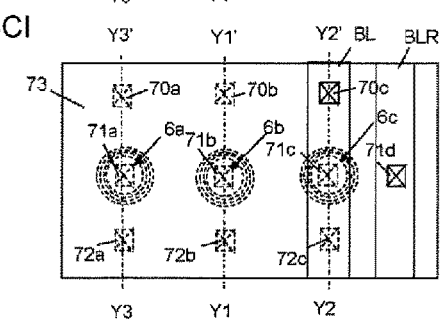

A pillar-shaped semiconductor memory device including SGTs according to a third embodiment of the present invention will now be described with reference to FIGS. 4A to 4CI. FIG. 4A illustrates a schematic structural diagram of an SRAM cell of the third embodiment. FIGS. 4BA to 4BE illustrate a plan view and sectional structural views of the SRAM cell of the third embodiment. FIG. 4BA illustrates a plan view. FIG. 4BB illustrates a sectional structural view taken along line X-X' of FIG. 4BA. FIG. 4BC illustrates a sectional structural view taken along line Y1-Y1' of FIG. 4BA. FIG. 4BD illustrates a sectional structural view taken along line Y2-Y2' of FIG. 4BA. FIG. 4BE illustrates a sectional structural view taken along line Y3-Y3' of FIG. 4BA. FIGS. 4CA to 4CI illustrate the positions of $N^+$ layers, $P^+$ layers, TiN layers, NiSi layers, and wiring metal layers in relation to the positions of the Si pillars 6*a*, 6*b*, and 6*c*, and to the positions of contact holes 70*a*, 70*b*, 70*c*, 71*a*, 71*b*, 71*c*, 71*d*, 72*a*, 72*b*, and 72*c*.

In this embodiment, as illustrated in the schematic structural diagram of the SRAM cell circuit of FIG. 4A, the positions of a source and a drain of each of the SGTs Pc1, Nc1, and SN1 in the circuit region C1 over the upper parts of the Si pillars SP1, SP2, and SP3 are changed upside down compared with the positions in FIG. 1B of the first embodiment. Likewise, in this embodiment, the positions of a source and a drain of each of the SGTs Pc2, Nc2, and SN2 in the circuit region C2 over the lower parts of the Si pillars SP1, SP2, and SP3 are changed upside down compared with the positions in FIG. 1B of the first embodiment. By virtue of this configuration, a source $P^+$ layer PS disposed in a middle part of the Si pillar SP1 does not require the $SiO_2$ layer Ox1 for dielectric isolation in FIG. 1B. Similarly, a source $N^+$ layer NS disposed in a middle part of the Si pillar SP2 does not require the $SiO_2$ layer Ox2 for dielectric isolation in FIG. 1B. Components of the Si pillars SP1, SP2, and SP3 located at the same height are connected to one another: a drain $P^+$ layer PD1, a drain $N^+$ layer ND1, and a drain $N^+$ layer SD1 are connected to one another; the gates Gp1 and Gn1 are connected to each other; and the gates Gp2 and Gn2 are connected to each other. A wire that connects the $P^+$ layer PD1, the $N^+$ layer ND1, and the $N^+$ layer SD1 to one another and a wire that connects the gates Gp2 and Gn2 to each other are connected to each other. A wire that connects the gates Gp1 and Gn1 to each other and a wire that connects a $P^+$ layer PD2, an $N^+$ layer ND2, and an $N^+$ layer SD2 to one another are connected to each other. The source $P^+$ layer PS in the middle part of the Si pillar SP1 is connected to the power supply terminal Vdd, and the source $N^+$ layer NS in the middle part of the Si pillar SP2 is connected to the ground terminal Vss. A source $N^+$ layer SS1 and a source $N^+$ layer SS2 disposed in a middle part of the Si pillar SP3 are respectively connected to the bit-line terminal BLt and the inverted bit-line terminal BLRt. The gates Gs1 and Gs2 of the Si pillar SP3 are connected to the word-line terminal WLt.

As illustrated in FIGS. 4BA to 4BE, a $P^+$ layer 73*a* is formed at the bottom of the Si pillar 6*a*, and an $N^+$ layer 73*b* is formed at the bottoms of the Si pillars 6*b* and 6*c* (which is illustrated in FIG. 4CA). The $P^+$ layer 73*a* and the $N^+$ layer 73*b* are formed adjacent to each other. On each of the upper surfaces of the $P^+$ layer 73*a* and the $N^+$ layer 73*b*, a tungsten (W) layer 69, for example, is affixed. A gate TiN layer 74*a* is formed as a single body around the Si pillars 6*a* and 6*b*, and a gate TiN layer 74*b* is formed so as to surround the Si pillar 6*c* (which is illustrated in FIG. 4CB). NiSi layers 75*a*, 75*b*, and 75*c* are respectively formed at the lower middle parts of the Si pillars 6*a*, 6*b*, and 6*c* (which is illustrated in FIG. 4CC). The NiSi layer 75*a* is formed so as to surround the Si pillar 6*a*. The NiSi layer 75*b* is formed so as to surround the Si pillar 6*b*. The NiSi layer 75*c* is formed so as to surround the Si pillar 6*c*. NiSi layers 76*a*, 76*b*, and 76*c* are respectively formed at the upper middle parts of the Si pillars 6*a*, 6*b*, and 6*c* (which is illustrated in FIG. 4CD). The NiSi layer 76*a* is formed so as to surround the Si pillar 6*a*. The NiSi layer 76*b* is formed so as to surround the Si pillar 6*b*. The NiSi layer 76*c* is formed so as to surround the Si pillar 6*c*. The NiSi layers 75*a* and 76*a* are connected to a $P^+$ layer 68*a* in a middle part of the Si pillar 6*a*. The NiSi layers 75*b* and 76*b* are connected to an $N^+$ layer 68*b* in a middle part of the Si pillar 6*b*. The NiSi layer 75*c* is connected to the $N^+$ layer 31*c* in a middle part of the Si pillar 6*c*. The NiSi layer 76*c* is connected to the $N^+$ layer 33*c* in the middle part of the Si pillar 6*c*. A gate TiN layer 77*a* is formed so as to surround the Si pillars 6*a* and 6*b*, and a gate TiN layer 77*b* is formed so as to surround the Si pillar 6*c* (which is illustrated in FIG. 4CE).

As illustrated in FIGS. 4BA to 4BE, four wiring metal layers are formed.

A wiring metal layer 78*a* and a wiring metal layer 78*b* are first wiring metal layers. The wiring metal layer 78*a* connects the $P^+$ layer 38*a*, the $N^+$ layer 38*b*, and the $N^+$ layer 38*c* at the tops of the Si pillars 6*a*, 6*b*, and 6*c* to the TiN layer 74*a* via the contact hole 71*a* extending to the Si pillar 6*a*, the contact hole 71*b* extending to the Si pillar 6*b*, the contact hole 71*c* extending to the Si pillar 6*c*, and the contact hole 70*a* extending to the TiN layer 74*a* (which is illustrated in FIG. 4CF). The wiring metal layer 78*b* connects the $N^+$ layer 73*b*, which is connected to the bottoms of the Si pillars 6*b* and 6*c*, to the gate TiN layer 77*a* surrounding the Si pillar 6*b* via the contact hole 70*b* (which is illustrated in FIG. 4CF).

The power supply wiring metal layer VDD and the ground wiring metal layer VSS are second wiring metal layers (which is illustrated in FIG. 4CG). The power supply wiring metal layer VDD is connected to the NiSi layers 75*a* and 76*a* via the contact hole 72*a*. The ground wiring metal layer VSS is connected to the NiSi layers 75*b* and 76*b* via the contact hole 72*b*.

The word-line wiring metal layer WL, which is a third wiring metal layer, connects via the contact hole 72*c* the gate TiN layer 74*b* surrounding the Si pillar 6*c* to the TiN layer 77*a* connected to the gate TiN layer 18*e* (which is illustrated in FIG. 4CH).

The bit-line wiring metal layer BL and the inverted bit-line wiring metal layer BLR are fourth wiring metal layers (which is illustrated in FIG. 4CI). The bit-line wiring metal layer BL is connected to the NiSi layer 75*c* surrounding the Si pillar 6*c* via the contact hole 70*c*, and the inverted bit-line wiring metal layer BLR is connected to the NiSi layer 76*c* via the contact hole 71*d*.

In this manner, the SRAM cell circuit illustrated in FIG. 4A is formed.

The pillar-shaped semiconductor memory device and the method for producing the device according to the third embodiment have the following effects.

1. In the first embodiment, the i-layers 2*a*1, 2*a*2, and 2*a*3 separate from one another are respectively formed at the bottoms of the Si pillars 6*a*, 6*b*, and 6*c*, and the $P^+$ layer 8*aa*, the N+ layer 8bb, and the N+ layer 8cc are respectively formed at the i-layers 2a1, 2a2, and 2a3. By contrast, in the third embodiment, the P+ layer 73a surrounding the Si pillar 6a and the N+ layer 73b surrounding the Si pillars 6b and 6c are formed in a connected manner. By virtue of this configuration, the third embodiment does not require regions like those required in the first embodiment for separating the i-layers 2a1, 2a2, and 2a3 from one another. This reduces the length of an SRAM cell in the line X-X' direction, leading to an increase in the density of an SRAM cell circuit.

2. The third embodiment does not require the contact holes 40a and 40b extending to the NiSi layer 28aa and overlapping each other in plan view or the contact holes 40c and 40d extending to the TiN layer 18a, the contact holes being formed in the first embodiment. In the third embodiment, the contact holes 70a, 70b, 70c, 71a, 71b, 71c, 71d, 72a, 72b, and 72c are formed by piercing insulating layers alone. This facilitates the production of an SRAM circuit. When a contact hole (corresponding to the contact hole 63 in the second embodiment) configured such that the inverted bit-line wiring metal layer BLR, when viewed in plan, overlaps the bit-line wiring metal layer BL is used as in the second embodiment, an even smaller SRAM cell circuit can be achieved.

3. The third embodiment does not require the SiO$_2$ layer 3a in the middle part of the Si pillar 6a or the SiO$_2$ layer 3b in the middle part of the Si pillar 6b, the SiO$_2$ layers being used for insulation in the first embodiment. By virtue of this, in the process corresponding to FIGS. 2AA to 2AD, ion implantation may be performed only on the region of the Si pillar 6c, for example, by impinging oxygen ions (O+) on the upper surface of the SiO$_2$ layer substrate 1 at an acceleration voltage of 100 to 200 KV and a dosage of $2\times10^{18}/cm^2$ to form the SiO$_2$ layer 3c. Since such high-acceleration-voltage oxygen ion implantation, which may lead to a decrease in carrier mobility, is not performed on the regions of the Si pillars 6a and 6b, SGTs that show no degradation in the performance of the Si pillars 6a and 6b can be readily formed. Alternatively, as in the first embodiment, the SiO$_2$ layers 3a and 3b for insulation may be respectively formed in the middle parts of the Si pillars 6a and 6b by the above method. Forming the SiO$_2$ layers 3a and 3b would not present any problems in the operation of an SRAM cell circuit.

Fourth Embodiment

Figure 5:
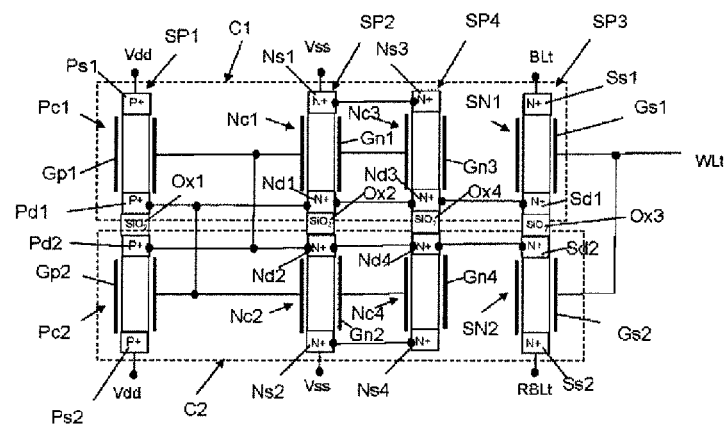
FIG. 5 is a schematic structural diagram for explaining a pillar-shaped semiconductor memory device including SGTs according to a fourth embodiment of the present invention.
Figure 6:
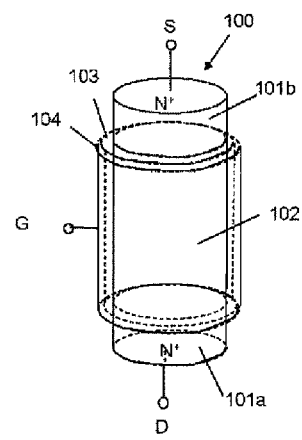
FIG. 6 is a schematic structural view illustrating a conventional SGT.

A pillar-shaped semiconductor memory device including SGTs according to a fourth embodiment of the present invention will now be described with reference to FIG. 5. FIG. 5 illustrates a schematic structural diagram of an SRAM cell according to the fourth embodiment.

In FIG. 5, in comparison with FIG. 1B of the first embodiment, a Si pillar SP4 is formed adjacent to the Si pillar SP2. The Si pillar SP4 includes in its upper and lower parts an N-channel SGT Nc3 and an N-channel SGT Nc4. The N-channel SGTs Nc3 and Nc4 are separated by a SiO$_2$ layer Ox4 disposed in a middle part of the Si pillar SP4. A drain N+ layer Nd3 is formed above the SiO$_2$ layer Ox4. A source N+ layer Ns3 is formed at the top of the Si pillar SP4. A gate Gn3 is formed so as to surround a portion of the Si pillar SP4 between the N+ layers Nd3 and Ns3. A drain N+ layer Nd4 is formed below the SiO$_2$ layer Ox4. A source N+ layer Ns4 is formed at the bottom of the Si pillar SP4. A gate Gn4 is formed so as to surround a portion of the Si pillar SP4 between the N+ layers Nd4 and Ns4. The N+ layers Ns1 and Ns3 are connected to each other. The N+ layers Nd1 and Nd3 are connected to each other. The N+ layers Nd2 and Nd4 are connected to each other. The N+ layers Ns2 and Ns4 are connected to each other. The gates Gn1 and Gn3 are connected to each other. The gates Gn2 and Gn4 are connected to each other.

As illustrated in FIG. 5, the N-channel SGT Nc3 is connected in parallel to the driver N-channel SGT Nc1 in the circuit region C1, and the N-channel SGT Nc4 is connected in parallel to the driver N-channel SGT Nc2 in the circuit region C2. This configuration can provide an SRAM cell circuit with an increased driving capability, leading to a high-speed SRAM circuit. This embodiment is applicable to the other embodiments.

In the first embodiment, the Si pillars 6a, 6b, and 6c are formed on the SiO$_2$ layer substrate 1 to form an SRAM cell circuit; however, the SiO$_2$ layer substrate 1 may be replaced with a Si substrate. In this case, the Si substrate preferably has on its surface a well structure corresponding to the N+ layer or the P+ layer, serving as a source or a drain, at the bottoms of the Si pillars 6a, 6b, and 6c. This is also applicable to the other embodiments according to the present invention.

In the first embodiment, two SGTs are formed in each of the Si pillars 6a, 6b, and 6c to form an SRAM cell circuit; however, another circuit may be formed in the upper part or the lower part of each of the Si pillars 6a, 6b, and 6c. This is also applicable to the other embodiments according to the present invention.

In the first embodiment, the SiO$_2$ layer substrate 1 is used; however, a substrate obtained by replacing the lower part of the SiO$_2$ layer substrate 1 with a Si substrate may also be used. The SiO$_2$ layer substrate 1 and the substrate in the lower part each may be an insulating material layer made of a material other than SiO$_2$.

In the first embodiment, the NiSi layers 28a and 28b are expanded into the spaces 25a, 25b, and 25c as a result of silicide formation in the P-type poly-Si layers 22a, 22b, and the N+-type poly-Si layers 26a, 26b due to Ni atoms in the Ni layers 21a and 21b. The expansion of silicide layers into the spaces 25a, 25b, and 25c may be performed by using other layers made of a metal such as titanium (Ti) or cobalt (Co) in place of the Ni layers 21a and 21b. This is also applicable to the other embodiments according to the present invention.

In the first embodiment, the P-type poly-Si layers 22a and 22b each containing an acceptor impurity are respectively formed above the Ni layers 21a and 21b; however, the P-type poly-Si layers 22a and 22b each containing an acceptor impurity may be respectively formed below the Ni layers 21a and 21b. This is also applicable to the other embodiments according to the present invention.

In the first embodiment, the NiSi layers 28a and 28b are formed by heat treatment after stacking the P-type poly-Si layer 22a and the N+-type poly-Si layer 26a on the Ni layer 21a, and the P-type poly-Si layer 22b and the N+-type poly-Si layer 26b on the Ni layer 21b. The Ni layer 21a may be formed either above or below the P-type poly-Si layer 22a and the N+-type poly-Si layer 26a, and the Ni layer 21b may be formed either above or below the P-type poly-Si layer 22b and the N+-type poly-Si layer 26b. A plurality of NiSi layers may be formed from a plurality of Ni layers and a plurality of poly-Si layers. This is also applicable to the other embodiments according to the present invention.

In the first embodiment, the connection of the NiSi layers 28aa and 28bb to the side surfaces of the Si pillars 6a, 6b, and 6c, and the formation of NiSi layers, P+ layers, and N+ layers in Si pillars: the NiSi layers 30a, 32a, and the P+ layers 31*a*, 33*a* in the Si pillar 6*a*; the NiSi layers 30*b*, 32*b*, the N⁺ layers 31*b*, 33*b* in the Si pillar 6*b*; and the NiSi layers 30*c*, 32*c*, and the N⁺ layers 31*c*, 33*c* in the Si pillar 6*c*, are performed by heat treatment as illustrated in FIGS. 2KA to 2KD. The connection of the NiSi layers 28*aa* and 28*bb* to the side surfaces of the Si pillars 6*a*, 6*b*, and 6*c*, and the formation of NiSi layers, P⁺ layers, and N⁺ layers in Si pillars: the NiSi layers 30*a*, 32*a*, and the P⁺ layers 31*a*, 33*a* in the Si pillar 6*a*; the NiSi layers 30*b*, 32*b*, the N⁺ layers 31*b*, 33*b* in the Si pillar 6*b*; and the NiSi layers 30*c*, 32*c*, and the N⁺ layers 31*c*, 33*c* in the Si pillar 6*c*, may be performed at any timing before the final process for producing SGTs. This is also applicable to the other embodiments according to the present invention.

In the first embodiment, the N⁺-type poly-Si layers 26*a* and 26*b* are used; however, an amorphous layer may also be used. This is also applicable to the other embodiments according to the present invention.

In the first embodiment, the SiN layers 15 and 35, that is, single material layers are used; however, composite material layers, for example, a composite material layer including in its lower part a SiO₂ layer and in its upper part a SiN layer may be used. Insulating material layers having low HF ion diffusivity may be used in place of the SiN layers 15 and 35. This is also applicable to the other embodiments according to the present invention.

In the above-described embodiments, Si (silicon) pillars are used as semiconductor pillars. However, the technical idea of the present invention is not limited to these embodiments and is also applicable to semiconductor devices including SGTs including semiconductor pillars made of semiconductor materials other than silicon.

The SRAM cell circuits in the above-described embodiments each has a circuit configuration in which the circuit regions C1 and C2 each includes a CMOS inverter circuit and a selection N-channel SGT; however, the present invention is also applicable to SRAM cell circuits having other circuit configurations if the circuit regions C1 and C2 have the same circuit configuration.

In the first embodiment, gate conductive layers are the TiN layers 18*a*, 18*b*, 18*c*, and 18*d*. However, the gate conductive layers may be made of any other metal material. Furthermore, the gate conductive layers each may have a multilayer structure composed of a metal layer and any other layer such as a poly-Si layer. This is also applicable to the other embodiments according to the present invention.

In the third embodiment, the tungsten (W) layer 69 is formed on the surfaces the P⁺ layer 73*a* and the N⁺ layer 73*b*. The W layer may be any other metal material layer. The W layer may be a conductor layer such as a silicide layer. The bottom of the W layer 69, the other metal material layer, or the silicide layer may be in contact with the upper surface of the SiO₂ layer substrate 1. This is also applicable to the other embodiments according to the present invention.

In the SRAM cell circuit according to the first embodiment, the Si pillar 6*a* (corresponding to SP1 in FIG. 1B) including P-channel SGTs corresponding to the load transistor P-channel SGTs Pc1 and Pc2, and the Si pillar 6*b* (corresponding to SP2 in FIG. 1B) including N-channel SGTs corresponding to the drive transistor N-channel SGTs Nc1 and Nc2 are formed adjacent to each other. This configuration can avoid an increase in the area of the SRAM cell circuit region. Such an increase can be caused when the Si pillar 6*c* (corresponding to SP3 in FIG. 1B) including N-channel SGTs corresponding to the selection transistor N-channel SGTs SN1 and SN2 is formed between the Si pillar 6*a* and the Si pillar 6*b*, because the TiN layer 18*a* and the NiSi layer 36*a* connected to the outer peripheries of the Si pillars 6*a* and 6*b* need to be formed such that these layers, when viewed in plan, detour the TiN layer 18*b* and the NiSi layer 36*b* connected to the outer periphery of the Si pillar 6*c*. This is also applicable to the other embodiments according to the present invention.

In the third embodiment, no SiO₂ layers are formed in the middle parts of the Si pillars 6*a* and 6*b*; however, forming the SiO₂ layers 3*a* and 3*b* in the first embodiment would not present any problem in the operation of an SRAM cell circuit.

In the first embodiment, the SiO₂ layer 23*a* is formed between the NiSi layers 28*a* and 28*b* as illustrated in FIGS. 2JB to 2JD; however, the SiO₂ layer 23*a* is not essential because two SGTs formed in each of the Si pillars 6*a*, 6*b*, and 6*c* have the same conductivity type. This is also applicable to the other embodiments according to the present invention.

In the first embodiment, a description was given of an SRAM circuit including SGTs each including a source and a drain that are impurity regions containing impurity atoms of the same polarity (e.g., the P⁺ region 8*aa* and the P⁺ region 31*a*), while the present invention is also applicable to an SRAM circuit including tunnel SGTs each including impurity regions, i.e., a source and a drain, containing impurity atoms of different polarities. This is also applicable to the other embodiments.

In the first embodiment, the P⁺ regions 31*a* and 33*a* and the N⁺ regions 31*b*, 33*b*, 31*c*, and 33*c* were formed by impurity diffusion from the NiSi layers 28*a* and 28*b*. The P⁺ regions 31*a* and 33*a* and the N⁺ regions 31*b*, 33*b*, 31*c*, and 33*c* may be formed by any other method. The same applies to the formation of the P⁺ regions 8*aa* and 38*a* and the N⁺ regions 8*bb*, 8*cc*, 38*b*, and 38*c*. For example, a Si layer including the P⁺ region 8*aa* and the N⁺ regions 8*bb* and 8*cc* is formed on the SiO₂ substrate 1 shown in FIG. 2AB. An i-type Si layer is then formed on the Si layer through an epitaxial process. A Si layer including the P⁺ region 31*a* and the N⁺ regions 31*b*, 33*b*, and 31*c* is then formed on the surface of the i-type Si layer. In this manner, a first substrate is formed. A second substrate including the SiO₂ layer 3, the i layer 4 thereon, and a Si layer formed at the bottom of the i layer 4, the Si layer including the P⁺ region 33*a* and the N⁺ regions 33*b* and 33*c*, is then provided. The Si layer of the first substrate, the Si layer including the P⁺ region 31*a* and the N⁺ regions 31*b*, 33*b*, and 31*c*, and the SiO₂ layer 3 of the second substrate are then bonded face-to-face. The second substrate is then polished to form the i layer 4. Subsequently, the Si pillars 6*a*, 6*b*, and 6*c* are formed. In this manner, the P⁺ regions 8*aa*, 31*a*, and 33*a*, and the N⁺ regions 8*bb*, 8*cc*, 31*b*, 31*c*, 33*b*, and 33*c* can be formed. This is also applicable to the other embodiments.

Various other embodiments and modifications are possible without departing from the broad spirit and scope of the present invention. The embodiments described above are merely illustrative of the present invention and are not intended to be restrictive of the scope of the present invention. The above-described embodiments and modifications may be freely combined. Some of the constituent features of the above-described embodiments may optionally be omitted, and such embodiments are still within the technical idea of the present invention.

The method for producing a pillar-shaped semiconductor memory device according to the present invention provides a semiconductor device with a high degree of integration.

What is claimed is:

1. A pillar-shaped semiconductor memory device comprising:
   a substrate;
   a first semiconductor pillar, a second semiconductor pillar, and a third semiconductor pillar, each standing in a direction perpendicular to a surface of the substrate;
   a first impurity region and a second impurity region separated from each other in the first semiconductor pillar;
   a first gate insulating layer surrounding a portion of the first semiconductor pillar between the first impurity region and the second impurity region in the perpendicular direction;
   a first gate conductor layer surrounding the first gate insulating layer;
   a third impurity region and a fourth impurity region separated from each other below the first impurity region and the second impurity region in the first semiconductor pillar;
   a second gate insulating layer surrounding a portion of the first semiconductor pillar between the third impurity region and the fourth impurity region in the perpendicular direction;
   a second gate conductor layer surrounding the second gate insulating layer;
   a fifth impurity region and a sixth impurity region separated from each other in the second semiconductor pillar;
   a third gate insulating layer surrounding a portion of the second semiconductor pillar between the fifth impurity region and the sixth impurity region in the perpendicular direction;
   a third gate conductor layer surrounding the third gate insulating layer;
   a seventh impurity region and an eighth impurity region separated from each other below the fifth impurity region and the sixth impurity region in the second semiconductor pillar;
   a fourth gate insulating layer surrounding a portion of the second semiconductor pillar between the seventh impurity region and the eighth impurity region in the perpendicular direction;
   a fourth gate conductor layer surrounding the fourth gate insulating layer;
   a ninth impurity region and a tenth impurity region separated from each other in the third semiconductor pillar;
   a fifth gate insulating layer surrounding a portion of the third semiconductor pillar between the ninth impurity region and the tenth impurity region in the perpendicular direction;
   a fifth gate conductor layer surrounding the fifth gate insulating layer;
   an eleventh impurity region and a twelfth impurity region separated from each other below the ninth impurity region and the tenth impurity region in the third semiconductor pillar;
   a sixth gate insulating layer surrounding a portion of the third semiconductor pillar between the eleventh impurity region and the twelfth impurity region in the perpendicular direction;
   a sixth gate conductor layer surrounding the sixth gate insulating layer; and
   a first interlayer insulating layer disposed in the third semiconductor pillar between a lower of the ninth impurity region and the tenth impurity region in the perpendicular direction and an upper of the eleventh impurity region and the twelfth impurity region in the perpendicular direction,
   wherein the first impurity region, the second impurity region, the first gate insulating layer, and the first gate conductor layer constitute a first surrounding gate MOS transistor (SGT),
   the third impurity region, the fourth impurity region, the second gate insulating layer, and the second gate conductor layer constitute a second SGT,
   the fifth impurity region, the sixth impurity region, the third gate insulating layer, and the third gate conductor layer constitute a third SGT,
   the seventh impurity region, the eighth impurity region, the fourth gate insulating layer, and the fourth gate conductor layer constitute a fourth SGT,
   the ninth impurity region, the tenth impurity region, the fifth gate insulating layer, and the fifth gate conductor layer constitute a fifth SGT,
   the eleventh impurity region, the twelfth impurity region, the sixth gate insulating layer, and the sixth gate conductor layer constitute a sixth SGT,
   the first impurity region, the fifth impurity region, and the ninth impurity region are connected to a first wiring conductor layer,
   the second gate conductor layer and the fourth gate conductor layer are connected to a second wiring conductor layer,
   the first wiring conductor layer and the second wiring conductor layer are connected to each other,
   the third impurity region, the seventh impurity region, and the eleventh impurity region are connected to a third wiring conductor layer,
   the first gate conductor layer and the third gate conductor layer are connected to a fourth wiring conductor layer,
   the third wiring conductor layer and the fourth wiring conductor layer are connected to each other, and
   the fifth gate conductor layer and the sixth gate conductor layer are connected to each other,
   thereby constituting an SRAM cell circuit.

2. The pillar-shaped semiconductor memory device according to claim 1, further comprising:
   a second interlayer insulating layer in a middle part of the first semiconductor pillar; and
   a third interlayer insulating layer in a middle part of the second semiconductor pillar,
   wherein the first impurity region is above the second interlayer insulating layer in a connected manner,
   the second impurity region is above the first impurity region,
   the third impurity region is below the second interlayer insulating layer in a connected manner,
   the fourth impurity region is below the third impurity region,
   the fifth impurity region is above the third interlayer insulating layer in a connected manner,
   the sixth impurity region is above the fifth impurity region,
   the seventh impurity region is below the third interlayer insulating layer in a connected manner,
   the eighth impurity region is below the seventh impurity region,
   the ninth impurity region is above the first interlayer insulating layer, which is formed in a middle part of the third semiconductor pillar, in a connected manner,
   the tenth impurity region is above the ninth impurity region, the eleventh impurity region is below the first interlayer insulating layer in a connected manner, the twelfth impurity region is below the eleventh impurity region, the second impurity region and the fourth impurity region are connected to a power supply wiring conductor layer, the sixth impurity region and the eighth impurity region are connected to a ground wiring conductor layer, the fifth gate conductor layer and the sixth gate conductor layer are connected to a word-line wiring conductor layer, and one of the tenth impurity region and the eleventh impurity region is connected to a bit-line wiring conductor layer, and the other is connected to an inverted bit-line wiring conductor layer.

3. The pillar-shaped semiconductor memory device according to claim 1, further comprising:

a fourth interlayer insulating layer formed in a middle part of the first semiconductor pillar; and a fifth interlayer insulating layer formed in a middle part of the second semiconductor pillar, wherein the second impurity region is disposed above the fourth interlayer insulating layer in a connected manner, the first impurity region is formed above the second impurity region, the fourth impurity region is disposed below the fourth interlayer insulating layer in a connected manner, the third impurity region is formed below the fourth impurity region, the sixth impurity region is disposed above the fifth interlayer insulating layer in a connected manner, the fifth impurity region is formed above the sixth impurity region, the eighth impurity region is disposed below the fifth interlayer insulating layer in a connected manner, the seventh impurity region is formed below the eighth impurity region, the tenth impurity region is disposed above the first interlayer insulating layer, which is formed in the middle part of the third semiconductor pillar, in a connected manner, the ninth impurity region is formed above the tenth impurity region, the twelfth impurity region is disposed below the first interlayer insulating layer in a connected manner, the eleventh impurity region is formed below the twelfth impurity region, the second impurity region and the fourth impurity region are connected to a power supply wiring conductor layer, the sixth impurity region and the eighth impurity region are connected to a ground wiring conductor layer, the fifth gate conductor layer and the sixth gate conductor layer are connected to a word-line wiring conductor layer, and one of the tenth impurity region and the twelfth impurity region is connected to a bit-line wiring conductor layer, and the other is connected to an inverted bit-line wiring conductor layer.

4. The pillar-shaped semiconductor memory device according to claim 3, wherein a thirteenth impurity region is formed in place of the second impurity region, the fourth interlayer insulating layer, and the fourth impurity region, a fourteenth impurity region is formed in place of the sixth impurity region, the fifth interlayer insulating layer, and the eighth impurity region, the thirteenth impurity region is connected to the power supply wiring conductor layer, and the fourteenth impurity region is connected to the ground wiring conductor layer.

5. The pillar-shaped semiconductor memory device according to claim 1, further comprising:

a fourth semiconductor pillar adjacent to the second semiconductor pillar;

a fifteenth impurity region and a sixteenth impurity region formed separately from each other in the fourth semiconductor pillar;

a seventh gate insulating layer that surrounds a portion of the fourth semiconductor pillar between the fifteenth impurity region and the sixteenth impurity region in the perpendicular direction;

a seventh gate conductor layer that surrounds the seventh gate insulating layer;

a seventeenth impurity region and an eighteenth impurity region formed separately from each other below the fifteenth impurity region and the sixteenth impurity region in the fourth semiconductor pillar;

an eighth gate insulating layer that surrounds a portion of the fourth semiconductor pillar between the seventeenth impurity region and the eighteenth impurity region in the perpendicular direction; and an eighth gate conductor layer that surrounds the eighth gate insulating layer, wherein the fifth impurity region and the fifteenth impurity region are connected to each other, the sixth impurity region is connected to the sixteenth impurity region, the seventh impurity region in connected to the seventeenth impurity region, the eighth impurity region is connected to the eighteenth impurity region, the third gate conductor layer is connected to the seventh gate conductor layer, the fourth gate conductor layer is connected to the eighth gate conductor layer, the fifth impurity region and the fifteenth impurity region include an impurity atom of the same polarity, the sixth impurity region and the sixteenth impurity region include an impurity atom of the same polarity, the seventh impurity region and the seventeenth impurity region include an impurity atom of the same polarity, and the eighth impurity region and the eighteenth impurity region include an impurity atom of the same polarity.

6. The pillar-shaped semiconductor memory device according to claim 1, wherein the first semiconductor pillar and the second semiconductor pillar are formed adjacent to each other.

7. The pillar-shaped semiconductor memory device according to claim 1, wherein, in plan view, at least a portion of the third wiring conductor layer, at least a portion of the first wiring conductor layer, and at least a portion of the fourth wiring conductor layer overlap one another in the order mentioned, the device further comprising:

a first contact hole that extends through the at least a portion of the first wiring conductor layer and the at least a portion of the fourth wiring conductor layer and that is connected to the at least a portion of the third wiring conductor layer;

a first separation insulating layer on a side surface of the first wiring conductor layer facing an interior of the first contact hole; and a third wiring conductor layer-to-fourth wiring conductor layer-connecting wiring conductor layer that connects the third wiring conductor layer to the fourth wiring conductor layer via the first contact hole.

8. The pillar-shaped semiconductor memory device according to claim 1, wherein, in plan view, at least a portion of the second wiring conductor layer, at least a portion of the third wiring conductor layer, and at least a portion of the first wiring conductor layer overlap one another in the order mentioned, the device further comprising:

a second contact hole that extends through the at least a portion of the first wiring conductor layer and the at least a portion of the third wiring conductor layer and that is connected to the at least a portion of the second wiring conductor layer;

a second separation insulating layer on a side surface of the third wiring conductor layer facing an interior of the second contact hole; and a first wiring conductor layer-to-second wiring conductor layer-connecting wiring conductor layer that connects the first wiring conductor layer to the second wiring conductor layer via the second contact hole.

9. The pillar-shaped semiconductor memory device according to claim 2, wherein, in plan view, at least a portion of the bit-line wiring conductor layer and at least a portion of the inverted bit-line wiring conductor layer overlap each other, the device further comprising:

a third contact hole that extends through one of the at least a portion of the bit-line wiring conductor layer and the at least a portion of the inverted bit-line wiring conductor layer which is located lower than the other in the perpendicular direction;

a third separation insulating layer on a side surface of one of the at least a portion of the bit-line wiring conductor layer and the at least a portion of the inverted bit-line wiring conductor layer through which the third contact hole extends, the side surface facing an interior of the third contact hole; and a first signal wiring layer that connects via the third contact hole the tenth impurity region or the eleventh impurity region to one of the at least a portion of the bit-line wiring conductor layer and the at least a portion of the inverted bit-line wiring conductor layer through which the third contact hole does not extend.

10. The pillar-shaped semiconductor memory device according to claim 3, wherein, in plan view, at least a portion of the bit-line wiring conductor layer and at least a portion of the inverted bit-line wiring conductor layer overlap each other, the device further comprising:

a third contact hole that extends through one of the at least a portion of the bit-line wiring conductor layer and the at least a portion of the inverted bit-line wiring conductor layer which is located lower than the other in the perpendicular direction;

a third separation insulating layer on a side surface of one of the at least a portion of the bit-line wiring conductor layer and the at least a portion of the inverted bit-line wiring conductor layer through which the third contact hole extends, the side surface facing an interior of the third contact hole; and a first signal wiring layer that connects via the third contact hole the tenth impurity region or the eleventh impurity region to one of the at least a portion of the bit-line wiring conductor layer and the at least a portion of the inverted bit-line wiring conductor layer through which the third contact hole does not extend.

* * * * *